United States Patent
Napoli et al.

(10) Patent No.: US 9,794,687 B2
(45) Date of Patent: Oct. 17, 2017

(54) LOUDSPEAKER PROTECTION CIRCUITRY AND METHODS

(71) Applicant: Cirrus Logic International Semiconductor Ltd., Edinburgh (GB)

(72) Inventors: Roberto Napoli, Edinburgh (GB); Jason William Lawrence, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 14/867,758

(22) Filed: Sep. 28, 2015

(65) Prior Publication Data

US 2017/0094408 A1    Mar. 30, 2017

(51) Int. Cl.
*H03G 11/00* (2006.01)
*H04R 3/00* (2006.01)
(Continued)

(52) U.S. Cl.
CPC .......... *H04R 3/007* (2013.01); *H03G 3/001* (2013.01); *H03G 3/20* (2013.01); *H03G 3/3005* (2013.01);
(Continued)

(58) Field of Classification Search
CPC ........ H04R 3/007; H04R 29/003; H03F 1/52; H03G 3/001; H03G 3/20; H03G 3/3005
(Continued)

(56) References Cited

U.S. PATENT DOCUMENTS

2007/0160221 A1* 7/2007 Pfaffinger ............ H04R 29/001
                                                                    381/59
2009/0257599 A1  10/2009 Sand et al.
(Continued)

FOREIGN PATENT DOCUMENTS

EP    1799013 A1    6/2007
EP    2800397 A1   11/2014
(Continued)

OTHER PUBLICATIONS

Combined Search and Examination Report under Sections 17 and 18(3), Application No. GB1522496.7, 8 pages.
(Continued)

*Primary Examiner* — Disler Paul
(74) *Attorney, Agent, or Firm* — Jackson Walker L.L.P.

(57) ABSTRACT

This application relates to methods and apparatus for thermal protection of a loudspeaker (102). A controller (106) is configured to generate a control signal ($G_{mod}$) for modulating the gain of a signal processing chain (101) that drives the loudspeaker. The controller is configured such that the control signal is generated as a function of each of: an indication of voice coil temperature of the loudspeaker ($T_{VC}$); an indication of power dissipation in the voice coil of the loudspeaker ($P_{VC}$); and an indication of a reservoir temperature ($T_{res}$) of a thermal reservoir for heat flow from the voice coil. The reservoir temperature may be an ambient temperature of the environment or a temperature of a component of the loudspeaker or apparatus that acts as a heat sink.

27 Claims, 9 Drawing Sheets

(51) Int. Cl.
  *H03G 3/00* (2006.01)
  *H03G 3/20* (2006.01)
  *H04R 29/00* (2006.01)
  *H03G 3/30* (2006.01)
  *H03F 1/52* (2006.01)

(52) U.S. Cl.
  CPC ............. *H04R 29/003* (2013.01); *H03F 1/52* (2013.01); *H04R 2430/01* (2013.01)

(58) Field of Classification Search
  USPC ................................................ 381/55, 58–59
  See application file for complete search history.

(56) References Cited

U.S. PATENT DOCUMENTS

| | | | |
|---|---|---|---|
| 2013/0077794 A1* | 3/2013 | Risbo | H03G 11/008 381/55 |
| 2013/0077796 A1 | 3/2013 | Risbo et al. | |
| 2013/0083928 A1 | 4/2013 | Williams et al. | |
| 2014/0086418 A1* | 3/2014 | Lubberhuizen | H04R 9/022 381/55 |
| 2014/0126730 A1* | 5/2014 | Crawley | H04R 29/001 381/59 |
| 2015/0215704 A1 | 7/2015 | Magrath et al. | |

FOREIGN PATENT DOCUMENTS

| | | |
|---|---|---|
| EP | 2806656 A1 | 11/2014 |
| GB | 2498602 A | 9/2012 |
| GB | 2522449 A | 7/2015 |

OTHER PUBLICATIONS

International Search Report and Written Opinion of the International Searching Authority, International Application No. PCT/GB2016/052927, mailed Jan. 24, 2017.

\* cited by examiner

LOUDSPEAKER PROTECTION CIRCUITRY AND METHODS

FIELD OF DISCLOSURE

This invention relates to methods and apparatus for protecting loudspeakers, and especially to methods and apparatus for detecting the ambient or magnet temperature of a loudspeaker to control the drive signal supplied to the loudspeaker so as to avoid voice coil over-temperature.

BACKGROUND

A number of different products include audio circuitry, such as an audio amplifier, together with one or more loudspeakers and/or connections for driving one or more loudspeakers of a peripheral apparatus such as a headset. In some instances the loudspeaker(s) chosen will be robust enough and large enough to handle the maximum power level at which the amplifier could drive signals continuously into it, even under the worst case environmental conditions, for instance maximum supply voltage, maximum ambient temperature etc. However having robust enough loudspeakers is not always economical, and for portable devices in particular the desire is typically to make the speaker as small and light as possible. This can potentially lead to the audio drive circuitry overloading the loudspeaker. One particular problem is thermal overload of the loudspeaker.

A typical loudspeaker comprises a diaphragm which is driven by a voice coil supported relative to a magnet. In use, typically, an analogue audio drive signal is applied to the voice coil to drive the loudspeaker. High levels of audio signal may give rise to high current levels in the voice coil, which may cause it to heat up due to ohmic losses associated with the electrical resistance of the coil. Excessive voice coil temperature may give rise to reliability problems, for example the glue attaching component parts of the mechanism may soften or melt, or the permanent magnet may be demagnetized or the ferro-magnetic properties of the core may degrade.

The audio amplifier circuitry may therefore be controlled by thermal protection control circuitry to limit the output power it can deliver to the loudspeaker so that the maximum power dissipated in the voice coil does not cause the voice coil temperature to exceed some specified safe limit.

However the maximum power that may be allowed to be dissipated in the voice coil will be dependent on the ambient temperature. It will be appreciated that heat generated in the voice coil will flow to the surrounding environment via various thermal paths (with associated thermal resistances) to the environment which will be at an ambient temperature. At a hot ambient temperature, less power can be dissipated before the voice coil temperature rises to a maximum limit compared to a cooler ambient. The output power limit may thus be set to a value appropriate for a maximum likely or specified temperature. However this does mean that the output power may be unnecessarily limited when operating with a more usual or even unusually low ambient temperature.

To mitigate this, the voice coil temperature may be sensed and the power applied adjusted to control the measured coil temperature. However the gain of the control loop is preferably designed to be low, to avoid sudden audible changes in power level. Thus the maximum power is still somewhat dependent on other influences such as ambient temperature variations, and may still be less than the maximum actually allowable.

SUMMARY

Embodiments of the present invention provide methods and apparatus for speaker protection that at least mitigate at least some of the above mentioned disadvantages.

Thus according to the present invention there is provided a system for thermal protection of a loudspeaker comprising:
  a controller configured to generate a control signal for modulating the gain of a signal processing chain driving said loudspeaker,
  wherein said controller is configured such that the control signal is generated as a function of each of:
  an indication of voice coil temperature of the loudspeaker;
  an indication of power dissipation in the voice coil of the loudspeaker; and
  an indication of a reservoir temperature of a thermal reservoir for heat flow from the voice coil.

In some embodiments the controller comprises a power limit module configured to determine an allowed power function of an allowed power dissipation with voice coil temperature based on said indication of a reservoir temperature. The controller may also comprise a gain calculation module configured to determine a gain setting based on the indication of voice coil temperature, the indication of power dissipation in the voice coil and the allowed power function. The control signal may be based on the gain setting.

The power limit module may be configured to determine the allowed power function such that the allowed power dissipation at a maximum allowed temperature of the voice coil depends on said indication of a reservoir temperature. The power limit module may be configured to determine the allowed power function such that the allowed power dissipation at the maximum allowed temperature corresponds to a power dissipation that leads to a substantially steady state temperature of the voice coil at the relevant reservoir temperature.

In some embodiments the power limit module may be configured to determine the allowed power function for a voice coil temperature range between a threshold temperature and said maximum allowed temperature. The allowed power function between the threshold temperature and said maximum allowed temperature may correspond to at least one of: an S-shaped curve, a polynomial curve, a Bezier curve; or a spline curve.

The power limit module may be configured to determine the allowed power function such that for any voice coil temperature below a the threshold temperature no limit on allowed power is applied.

In some embodiments the power limit module may be configured to determine the allowed power function such that the allowed power dissipation at the threshold temperature is based on the indication of power dissipation in the voice coil of the loudspeaker.

In some embodiments the gain calculation module may be configured to determine the gain setting based on an allowed power dissipation determined according to the allowed power function and the indication of power dissipation in the voice coil. The gain calculation module may be configured to determine the gain setting according to a gain control transfer function. The gain control transfer function may vary the gain setting from a first gain setting at a first value of power dissipation in the voice coil of the loudspeaker to a second gain setting at a second value of power dissipation in the voice coil, wherein the first gain setting corresponds to a maximum gain setting and the second gain setting corresponds to a lower gain setting. The second value of power dissipation in the voice coil may correspond to the allowed power dissipation and the second gain setting corresponds to a gain setting that would lead to a power dissipation substantially equal to the allowed power dissipation if an input signal to the signal processing chain driving said loudspeaker was at a maximum level.

In some embodiments the system may comprise an estimation module configured to determine the indication of reservoir temperature based on said indication of power dissipation of the voice coil. The estimation module may comprise a temperature rise module configured to determine an estimated temperature rise based on the indication of power dissipation of the voice coil and a thermal impedance model of a thermal path between the voice coil and the thermal reservoir; and a reservoir temperature estimation module configured to determine the indication of reservoir temperature based on the indication of voice coil temperature and the estimated temperature rise.

The estimation module may comprise at least one input for receiving a first signal indicative of voltage applied to the voice coil of said loudspeaker and a second signal indicative of current flowing in said voice coil and is configured to determine said indication of temperature of the voice coil and said indication of power dissipation in the voice coil based on said first and second signals; wherein at least said estimate of temperature is based on an estimate of resistance of said voice coil which is determined based on said first and second signals. The estimation module may be configured to determine the estimate of voice coil resistance based on: the difference between the value of said estimated voice coil resistance and a reference resistance value at a known temperature; and a temperature coefficient for the loudspeaker voice coil.

In some embodiments the estimation module may be configured to determine the indication of power dissipation based on said estimated voice coil resistance and the second signal indicative of current flowing in said voice coil. The estimation module may be configured to determine the estimate of power dissipation by multiplying said estimated voice coil resistance by the square of the value of the second signal indicative of current flowing in said voice coil.

In some embodiments the system may comprise a temperature sensor configured to measure said indication of reservoir temperature.

In some embodiments the indication of a reservoir temperature may be an indication of an ambient temperature for the loudspeaker. In some embodiments the indication of a reservoir temperature may be an indication of the temperature of a component of the loudspeaker other than the voice coil. Such a component may be a magnet of the loudspeaker.

In embodiments with a gain control module, the gain control module may be configured to apply time domain processing to said gain setting to provide control signal. The time domain processing may comprise applying at least one of an attack time constant and a decay time constant to said gain control value to generate said control signal. The gain control module may be configured such that at least one of the attack time constant and a decay time constant is variable based on the indication of voice coil temperature.

In some embodiments the controller is configured to time the application of any gain changes to synchronize with zero crossings in the input signal. Additionally or alternatively the controller may be configured such that the maximum frequency of gain changes applied is maintained below a predetermined limit.

The system may comprise a gain element for applying a gain to the input signal. The gain element may be controlled by the controller. The controller may control the gain of the gain element based on said control signal and at least one other gain setting. The at least one other gain setting may be one of: a user controlled volume setting; a gain control setting for excursion limiting.

In some embodiments the controller may further comprise an excursion limiting module configured to generate a second gain setting for excursion limiting of the loudspeaker. In some embodiments the controller may be configured to generate the control signal for modulating the gain of a first gain element in the signal processing chain and also to further modulate the gain of a second gain element in the signal processing chain based on the second gain setting. Alternatively the controller may be configured such that the control signal is further based on said second gain setting, i.e., on both the first and second gain settings.

The system may comprise a signal processing chain for driving said loudspeaker. The system may also comprise the loudspeaker.

Embodiments also relate to an electronic apparatus comprising a system as described in any of the variants above. The apparatus may be at least one of: a portable device; a battery power device; a computing device; a communications device; a gaming device; a mobile telephone; a personal media player; a laptop, tablet or notebook computing device.

In another aspect there is provided a system for thermal protection of a loudspeaker comprising a power limit block for determining an allowed power function of power dissipation against temperature for a voice coil of a loudspeaker, wherein the power limit block has an input for receiving an indication of the temperature of a thermal reservoir for heat generated in the voice coil and wherein the allowed power function depends on said temperature of the thermal reservoir.

The power limit block may be configured such that the value of allowed power at a maximum temperature varies depends on said temperature of the thermal reservoir. The temperature of the thermal reservoir may be an ambient temperature for the loudspeaker.

In a further aspect there is provided a thermal protection system for a loudspeaker comprising:
  at least one input for receiving a first signal indicative of voltage applied to the voice coil of said loudspeaker and a second signal indicative of current flowing in said voice coil;
  a temperature and power estimation module configured to determine:
  an estimate of temperature of the voice coil based on an estimate of resistance of said voice coil which is determined based on said first and second signals;
  an estimate of power dissipation in the voice coil based on said first signal, second signals and/or said estimate of resistance of said voice coil; and
  an estimate of temperature of a thermal reservoir for heat produced in the voice coil based on a comparison of said estimate of temperature of the voice coil the voice coil and an estimate of rise of coil temperature based on a thermal speaker model and said estimate of power dissipation in the voice coil;
  a gain controller configured to generate a gain control signal for modulating the gain of a signal processing chain driving said loudspeaker, wherein said gain control signal is generated as a function of each of said estimate of temperature of said voice coil, said estimate of power dissipation in the voice coil and said estimate of temperature of a thermal reservoir.

In a yet further aspect there is provided a system for thermal protection of a voice coil of a loudspeaker comprising: a module configured to generate an estimate of temperature of said voice coil, an estimate of power dissipation in the voice coil and an estimate of a temperature of a thermal reservoir for heat produced in the voice coil based on a voltage applied to said voice coil and a current flowing through said voice coil and generate a gain control signal for modulating a gain of a signal processing chain driving said loudspeaker, wherein said gain control signal is based on said estimates of temperature of said voice coil, power dissipation in the voice coil and temperature of the thermal reservoir.

Aspects also relate to loudspeaker protection circuitry, for providing a gain control signal for controlling the gain applied to an input signal to provide a drive voltage into a loudspeaker voice coil, comprising a controller configured to:
  receive signals indicative of the voice coil current and drive voltage;
  calculate from said indicative signals, an estimate of the present voice coil temperature and an estimate of the power dissipation of the voice coil, wherein at least said estimate of voice coil temperature is based on an estimate of the present voice coil resistance which is determined from said indicative signals;
  calculate the temperature of a thermal reservoir from said estimate of voice coil temperature and said power dissipation and a thermal speaker model; and
  generate and output said gain control signal as a function of all three of the estimate of voice coil temperature, the estimate of power dissipation and the estimate of temperature of a thermal reference node.

In a further aspect there is provided a system for thermal protection of a loudspeaker comprising a power limit block for determining an allowed power function of allowed power dissipation for a voice coil temperature range between a lower threshold temperature and a higher threshold temperature, wherein the power limit block has an input for receiving an indication of the power dissipation in the voice coil and wherein the allowed power function is determined such that the allowed power dissipation at the lower temperature threshold corresponds substantially to the indication of the power dissipation in the voice coil.

BRIEF DESCRIPTION OF THE DRAWINGS

Embodiments of the invention will now be described, by way of example only, with reference to the accompanying drawings, of which.

DETAILED DESCRIPTION

Figure 1:
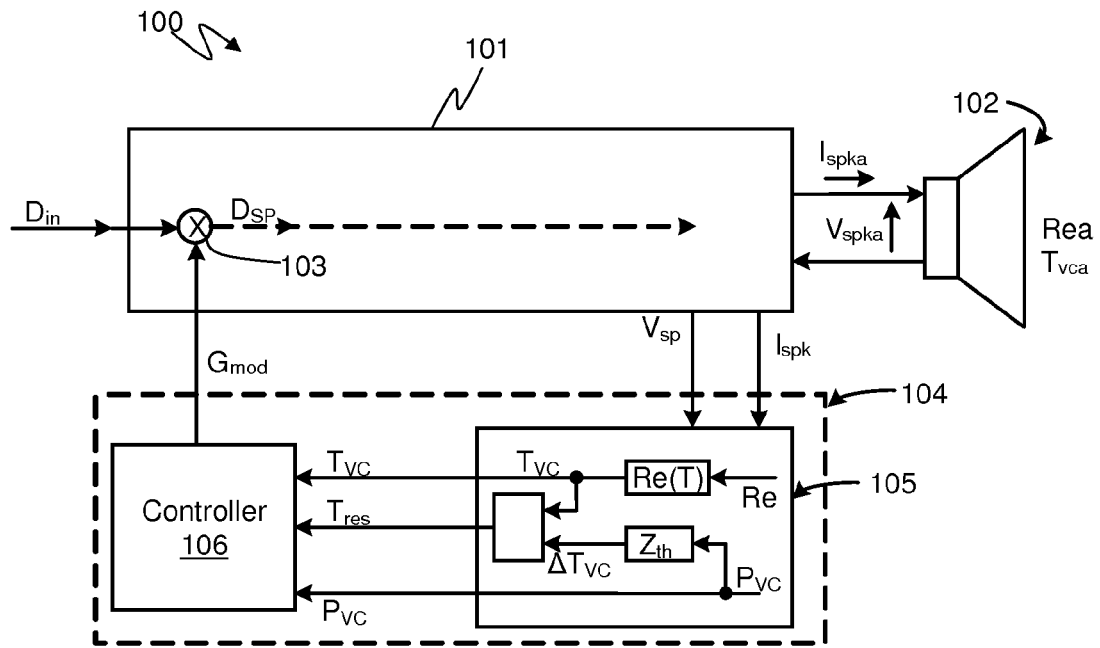
FIG. 1 illustrates an audio apparatus having a loudspeaker protection module according to an embodiment of the invention.

FIG. 1 illustrates an embodiment of audio driver amplifier circuitry 100 according to an embodiment of the invention. A signal processing chain 101 receives a digital input audio signal $D_{in}$ at an input terminal and processes it, eventually providing a signal to drive a loudspeaker 102. The input terminal may be a circuit contact such as bond pad or the like for connecting to another circuit or could simply be a node of a signal path which represents the input to the signal processing chain. For the avoidance of doubt the phrase "input terminal" as used herein includes an input node and no particular physical characteristics are implied by the word "terminal".

The signal processing chain 101 comprises a multiplier or digital gain stage 103 in the signal path and may also comprise elements such as digital filtering or other digital signal processing, digital-to-analogue convertors, and/or at least one Class D, Class AB or Class G or Class H power amplifier stage and associated modulation circuitry. The multiplier or gain stage 103 may apply a gain $G_{mod}$ to the signal. The signal processing chain may apply further gain $G_{xx}$ in the signal path so that there may be will have an overall gain from the input signal $D_{in}$ to the voltage signal $V_{spka}$ driven into the loudspeaker proportional to $G_{mod}$.

It should be noted that the digital processing circuitry may comprise at least some custom-designed logic circuitry and/or may comprise a general purpose processor running appropriate code. The loudspeaker may be grounded externally and driven from a single output terminal, or both loudspeaker terminals may be connected to the signal processing chain for example where both terminals are driven in from a full-bridge output stage or where the ground return current is passed through the driver circuitry as illustrated.

The signal processing chain 101 also comprises circuitry for sensing the current $I_{spka}$ actually flowing through the voice coil of the loudspeaker. This current $I_{spka}$ may, for example, be sensed in a power supply or ground return lead, monitored in series with the load, or monitored by sensing current through or voltage across amplifier output elements.

In this embodiment circuitry in the signal processing chain provides indicative signals $V_{spk}$ and $I_{spk}$, indicative of the actual voice coil drive voltage $V_{spka}$ and actual voice coil current $I_{spka}$ respectively, to a loudspeaker protection control module 104. The loudspeaker protection control module 104 receives these indicative signals $V_{spk}$ and $I_{spk}$ and derives an appropriate gain control signal $G_{mod}$ to control the digital gain stage 103 in order to modulate, i.e., reduce or increase, the gain of the signal processing chain so as to modulate the signal applied to the loudspeaker to a safe level. When the indicative voltage and current signals $V_{spk}$ and $I_{spk}$ suggest that there is danger of thermal overload of the loudspeaker the gain applied to the input signal $D_{in}$ is modulated such that it reduces the signal applied to the loudspeaker.

The loudspeaker protection control module 104 comprises power and temperature estimation module 105, which is arranged to determine, e.g., calculate, an estimate $P_{VC}$ of the present power dissipation of the voice coil and an estimate $T_{VC}$ of the voice coil temperature. The estimate $T_{VC}$ of the voice coil temperature may be based on a determination of the equivalent resistance Re of the voice coil (which is temperature dependent according to some known function $Re(T_{VC})$).

In this embodiment, the power and temperature estimation module 105 is also arranged to determine, e.g., calculate, an estimate $T_{res}$ of the temperature of a thermal reservoir in thermal communication with the voice coil. The estimate $T_{res}$ of the temperature of the thermal reservoir is an indication of the temperature of a reference node that is located at or near a thermal reservoir, e.g., a heat sink, for heat generated by power dissipation in the voice coil. As noted above heat generated in the voice coil may flow to the surrounding environment via various thermal paths. The surrounding environment thus acts as heat sink or thermal reservoir for heat generated in the voice coil and the estimate $T_{res}$ may thus be an estimate of the ambient temperature of the local environment. There may however be other components of the loudspeaker, such as a heavy magnet for instance, which may function as a thermal reservoir or heat sink in use, in which case the estimate $T_{res}$ may be an estimate of the temperature of such a component, e.g., the magnet temperature. In essence the estimate $T_{res}$ is an estimate of the temperature at the end of a thermal flow path for conducting heat away from the voice coil to the environment or a component acting as a thermal reservoir. The estimated thermal reservoir temperature $T_{res}$ may be deduced from a comparison of the measured coil temperature $T_{VC}$ and an estimate of the coil temperature rise $\Delta T_{VC}$ based on the estimated coil power dissipation $P_{VC}$ and on a thermal impedance model $Z_{th}$.

All of $T_{VC}$, $T_{res}$, and $P_{VC}$ may thus be calculated directly or indirectly from the monitored voltage and current signals Vspk and Ispk, as explained in more detail below.

The loudspeaker protection control module 104 further comprises controller 106 which generates the gain control signal Gmod, based on, i.e., as a function of, both the voice coil power dissipation estimate PVC and the voice coil temperature estimate TVC and the estimated thermal reservoir temperature Tres.

In general terms, the controller 106 receives information related to the power dissipation in the voice coil as well as the temperature of the voice coil and a thermal reservoir temperature, e.g., the ambient temperature, and, based on this information, determines any gain modulation to be applied. For speaker thermal protection the gain modulation applied will, when necessary, reduce the magnitude of the driving signal so as to reduce power dissipation. Typically therefore the gain modulation may be a modulation to reduce the overall gain. Thus if the power dissipation is relatively high and the voice coil temperature is also relatively high a gain modulation may be applied to reduce the gain applied to the input signal so as to reduce the level of power dissipation. If the power dissipation decreases and/or the voice coil temperature decreases this applied gain modulation may be at least partially removed to allow the magnitude of the drive signal to increase.

As explained in more detail below, the controller 106 may be configured to determine an allowed power limit based on the indication of voice coil temperature and the indication of the reservoir temperature, e.g., ambient temperature. The controller 106 may thence determine the value of the gain control signal, for modulating the gain applied to the drive signal voltage as a function of the indication of power dissipation in the loudspeaker and the allowed power limit Thus a greater gain modulation may be applied the closer the estimated value of power dissipation is to the allowed power limit, and this power limit may decrease if the reservoir temperature increases. Together the estimation module 105 and controller 106 comprise loudspeaker protection control module 104.

Figure 2:
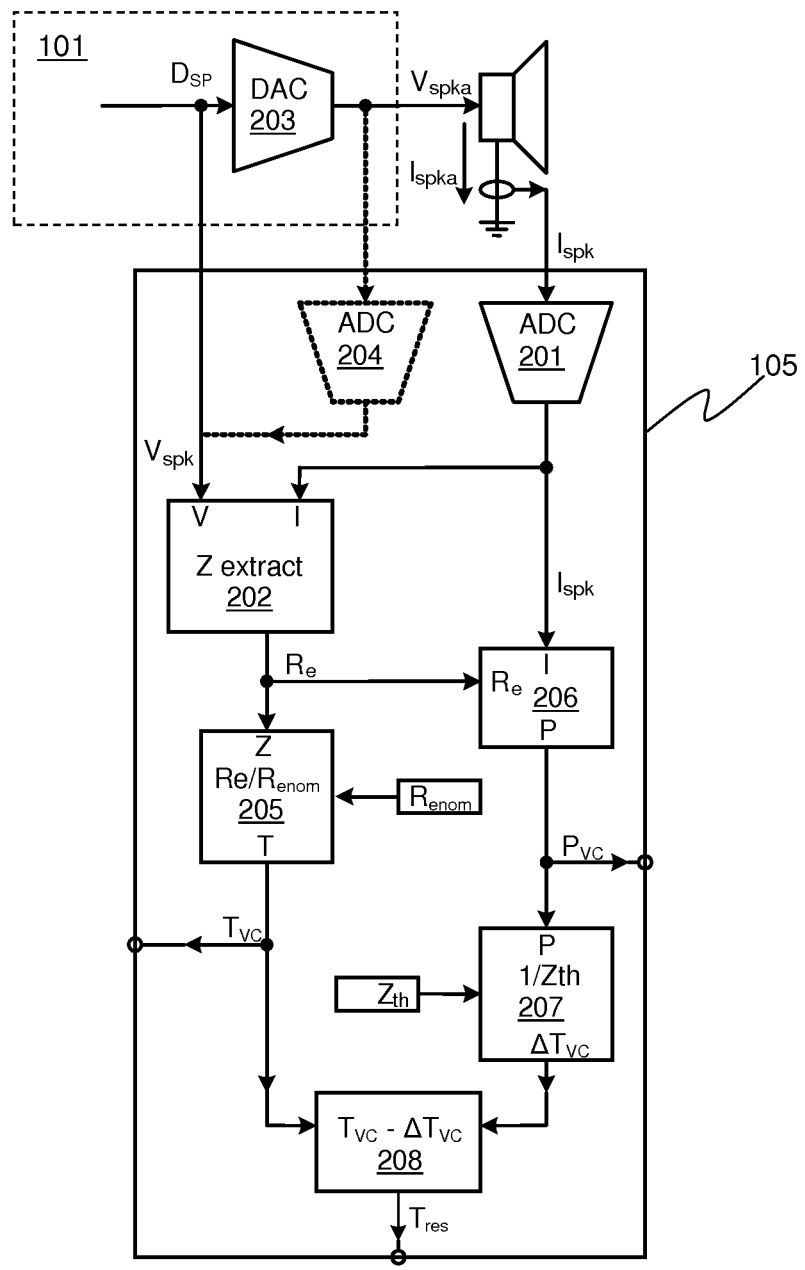
FIG. 2 illustrates a power and temperature extraction block according to an embodiment.

FIG. 2 illustrates one embodiment of a suitable estimation module, i.e., power and temperature extraction module 105.

The actual voice coil current $I_{spka}$ may be monitored by a suitable current sensor as is well known in the art and used to derive a signal $I_{spk}$ indicative of the coil current. In some embodiments an analogue output from the current sensor may be converted to a digital current signal $I_{spk}$ by an analogue-to-digital convertor (ADC) 201 possibly after some pre-processing e.g., analogue filtering, amplification etc. The digital current signal $I_{spk}$ is provided to an impedance extraction block 202.

The impedance extraction block 202 also receives an indication of the voltage applied to the loudspeaker, i.e., the drive voltage is monitored. In this embodiment a digital signal $D_{SP}$ derived from a suitable point of signal processing chain 101, e.g., from the input to a digital-to-analogue convertor (DAC) 203 of the signal processing chain, may be provided as an indication $V_{spk}$ of the voltage of the drive signal. In other words monitoring the drive voltage may comprise monitoring the digital signal used to generate the drive signal $V_{spka}$. However as illustrated in FIG. 2 it would alternatively be possible to monitor the drive signal $V_{spka}$ directly or via an ADC 204. It would also be possible to use the input signal $D_{in}$ itself, i.e., the input to the signal processing chain, together with an indication of the value of the gain control signal $G_{mod}$ and allowing for this and any other fixed or variable gain Gxx applied in the signal path.

Figure 3:
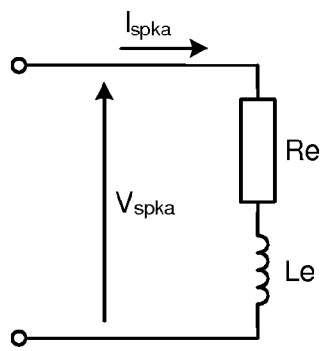
FIG. 3 illustrates an electrical model of a loudspeaker.

The impedance extraction block 105 determines an estimate of the present resistance Re of the voice coil, for example based on the relationship $Re=V_{spk}/I_{spk}$, although more sophisticated known techniques such as those involving adapting coefficients of an adaptive filter receiving waveforms of $V_{spk}$ and $I_{spk}$ may be used if desired. FIG. 3 illustrates an electrical model of a loudspeaker voice coil. When a voltage $V_{spka}$ is applied to the voice coil, a current $I_{spka}$ flows. The voice coil impedance observed as defined by $V_{spka}/I_{spka}$ comprises some inductance Le, but at audio frequencies the ohmic resistance Re of the coil winding may dominate.

Referring back to FIG. 2, the estimated value of resistance Re may be used to determine the temperature $T_{VC}$ of the voice coil by temperature estimation block 205. The resistance of the voice coil will have a temperature coefficient that may be known from an initial calibration step or estimated based on the type of loudspeaker used. The temperature coefficient may typically be of the order of about 4000 ppm/K. The variation of the estimated resistance with respect to some reference value $R_{enom}$, may be used to determine an estimated temperature of the voice coil.

The reference coil resistance value Renom may for instance be a stored nominal or test calibration value or which may be acquired in a self-calibration routine, for instance on start up. Note such a calibration would be purely an electrical measurement, at a single nominal temperature, so would not require the long measurement times of the order of the thermal time constants required for thermal impedance measurements. If the calibration value is obtained in production test (e.g., of the complete host device, or of just a flex circuit comprising the loudspeaker and associated circuitry) the ambient temperature at which this reference value is calibrated may be well controlled and known.

The estimate of voice coil resistance is also passed to power calculation block 206 which derives an estimate $P_{VC}$ of the power dissipation of the voice coil.

The power calculation block 206, in this embodiment, determines the power dissipated using the digital representation $I_{spk}$ of the speaker current and the determined resistance based on the relationship $P_{VC}=I_{spk}^2 \cdot Re$. The power calculation block may calculate the power over a plurality of audio cycles, say over a few tens to hundreds of milliseconds.

The power dissipated in the voice coil may cause a rise $\Delta T_{VC}$ in coil temperature. This rise in temperature will depend on the thermal resistance $R_{th}$ of a path to some thermal reservoir which can absorb the heat energy. This reservoir may be some heat sink component, or a relatively massy component such as the coil magnet, or more generally may just be the local environment at some ambient temperature. The thermal reservoir will be at a reservoir temperature $T_{res}$.

Using a value of thermal resistance from the voice coil to the reservoir of $R_{th}$, the expected temperature rise $\Delta T_{VC}$ of the voice coil over the reservoir, e.g., ambient, temperature will be $P_{VC} \cdot R_{th}$.

The temperature of the voice coil will be given by:

$$T_{VC}=T_{res}+\Delta T_{VC} \qquad (1)$$

Figure 4A:
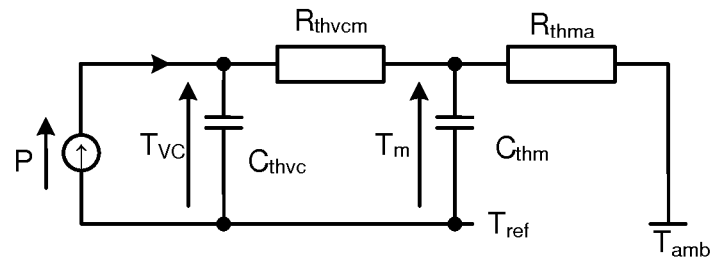
FIGS. 4a and 4b illustrate example thermal models of a loudspeaker.

Note that the thermal path to the reservoir, e.g., ambient, will generally include some thermal masses, and the path may be characterized by a complex thermal impedance $Z_{th}$ rather than just a simple thermal resistance. FIG. 4a illustrates a thermal model of a loudspeaker for thermal flow between the voice coil and a thermal reservoir, which in this model is the surrounding environment at an ambient temperature $T_{amb}$. The thermal mass of the voice coil is modelled by thermal capacitance $C_{thvc}$ which is at temperature $T_{VC}$ above a reference temperature value $T_{ref}$, say 300K. Assuming the reservoir temperature is not significantly changing over timescales of concern, the $T_{ref}$ node may conveniently be sorted to $T_{amb}$ node to simplify the model.

Figure 4B:
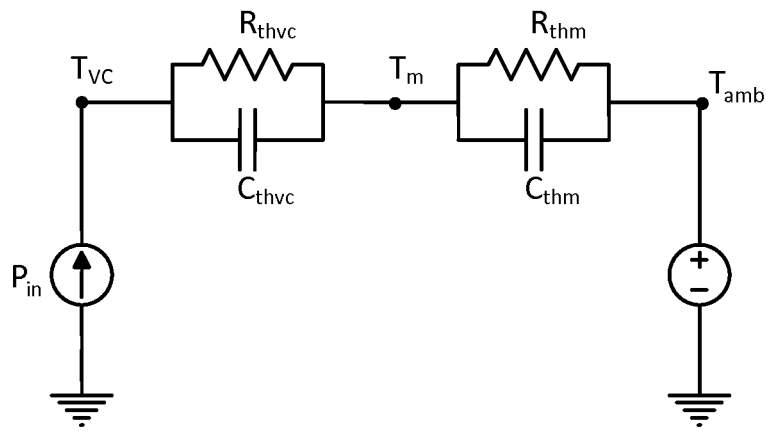

As mentioned above ohmic power losses can result in heating of the voice coil and thus an increase in the voice coil temperature $T_{VC}$. Power (modelled as thermal current) flows through a thermal resistance $R_{thvcm}$ to the adjacent magnet with thermal inertia represented by thermal capacitance $C_{thm}$ and thence via further thermal resistance $R_{thma}$ to the outside world, assumed to be an independently defined ambient temperature $T_{amb}$. It will be appreciated that this is a relatively simple model and more complex models could be developed if required, for instance including other components of the loudspeaker and/or temperature gradients within components such as the magnet. The alternative model illustrated in FIG. 4b may also be used for convenience. It will also be appreciated that other models could be developed for flow to other components of the loudspeaker or of the device hosting the loudspeaker that may act as a thermal reservoir.

As the power of the applied signal varies, so will the rise in temperature, but with a time lag and a time-averaging time constant of possibly hundreds of milliseconds. However, assuming the thermal impedance model $Z_{th}$ accurately reflects the coil thermal behavior, the actual temperature rise at the voice coil will have exactly the same transient behavior, so the difference between them will stay constant and equal to the reservoir temperature, i.e., in this model the ambient temperature. Essentially the ambient temperature acts as a ground reference voltage for the thermal equivalent circuit.

Thus referring back to FIG. 3 the temperature rise $\Delta T_{VC}$ is calculated by temperature rise block 207 based on the determined power dissipation $P_{VC}$ and a model of thermal impedance $Z_{th}$ to the thermal reservoir. The calculated temperature rise $\Delta T_{VC}$ and the voice coil temperature $T_{VC}$ derived from the estimated coil resistance may then be combined, e.g., by reservoir temperature estimation block 208, to provide an estimate $T_{res}$ for the reservoir temperature. In some embodiments $T_{res}$ may be derived by simple subtraction, i.e., via:

$$T_{res}=T_{VC}-\Delta T_{VC} \qquad (2)$$

In other embodiments a more complex derivation may be performed, for example an iterative solution. For example the present estimate $T_{VCest}$ of the temperature of the voice coil, based on input power $P_{VC}$ and estimated reservoir temperature $T_{res}$ may be defined as:

$$T_{VCest}[i]=H_T(q^{-1}) \cdot P_{VC}+T_{res}[i] \qquad (3)$$

where $H_T(q^{-1})$ is a discrete time model of the relevant thermal circuit, e.g., that shown in FIG. 4a. The next estimate of reservoir temperature may be given by:

$$T_{res}[i+1]=T_{res}[i]+\mu \cdot (T_{VC}[i]-T_{VCest}[i]) \qquad (4)$$

where $T_{VC}$ is the measured voice coil temperature, i.e., the voice coil temperature as deduced from the electrical resistance. The continuous time transfer function of $H_T(q^{-1})$ may be defined, for example, by:

$$H = \frac{1}{\frac{1}{R_{thvo}}+sC_{thvc}} + \frac{1}{\frac{1}{R_{thm}}+sC_{thm}} \qquad (5)$$

The discrete time transfer function can be defined from equation (5) using well established techniques.

Equation (5) is based on the reservoir temperature being the ambient temperature. As noted previously, in some embodiments the thermal reservoir may be identified as the magnet or some other loudspeaker component with a relatively high thermal capacity. Due to its relatively high thermal mass the magnet temperature changes only slowly and thus the magnet temperature can be seen as a local ambient. Using the magnet temperature as the reservoir temperature still allows the allowed power limit to be set as will be described below and has the advantage that a simple thermal model may be used, which may simplify calculations, e.g., of the estimated reservoir temperature, especially if an iterative approach is used, and which may be more robust to modelling errors. For example the model described above with reference to equation (5) may be simplified to:

$$H = \frac{1}{\frac{1}{R_{thve}} + sC_{thve}}$$ (6)

Figure 5:
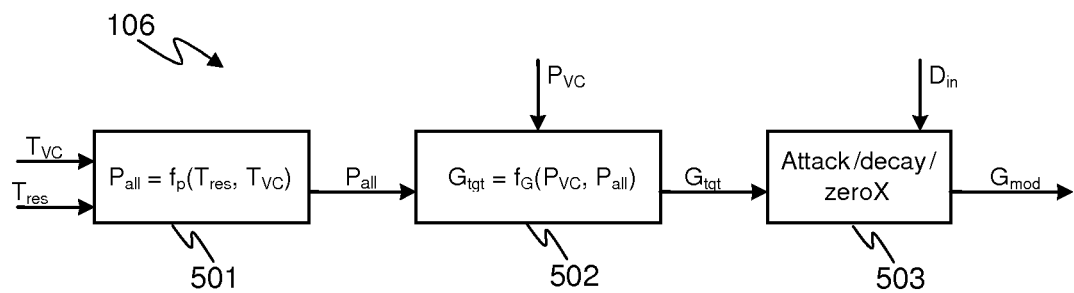
FIG. 5 illustrates a gain controller according to an embodiment.

The estimated values of temperature and power dissipation are then passed to the controller 106. FIG. 5 illustrates one example of a suitable controller. The voice coil temperature value $T_{VC}$ deduced from the coil resistance and the reservoir temperature $T_{res}$ are received by a power limit block 501 which, based on the present voice coil temperature determines the maximum short term or instantaneous power dissipation level $P_{all}$ that is permitted. This maximum allowed power value $P_{all}$ will be determined by a desired first transfer function $f_p(T_{res}, T_{VC})$, the form of which may vary depending on the particular implementation but which will generally decrease with increasing temperature, reducing to a level at or near zero at a certain voice coil temperature limit $T_{max}$. In general a transfer function $f_p(T_{VC})$ between the voice coil temperature $T_{VC}$ and allowed power $P_{all}$, will be selected based on the reservoir temperature.

A gain calculation block 502 receives the indication of the allowed short-term power level $P_{all}$ and also the estimate of the present level of power dissipation $P_{VC}$. The gain calculation block determines a gain control value, e.g., a target gain $G_{tgt}$, to be applied to the input signal, depending on the estimated present power dissipation, with the aim of keeping the instantaneous power dissipated at a level which in no greater than $P_{all}$.

In some embodiments the target gain signal $G_{tgt}$ may be used directly as a gain control signal. In some embodiments however a gain control block 503 may apply some time-domain processing on the target gain signal, for instance to reduce any audio artifacts caused by gain changes. For instance gain changes may only be applied when the input signal crosses zero to avoid steps introduced by gain changes applied to a non-zero part of the signal. The gain control block 503 may therefore also receive the input signal $D_{in}$ and synchronize the gain changes with respect to zero crossings to produce the gain control signal $G_{mod}$.

As mentioned above in general, at a given reservoir temperature, e.g., ambient temperature, the allowed power dissipation limit, $P_{all}$, will reduce towards zero as the voice coil temperature $T_{VC}$ increases towards a specified maximum voice coil temperature $T_{max}$ for the relevant loudspeaker, which may for instance be based on a recommendation from the loudspeaker manufacturer. This aims to ensure that $T_{VC}$ will never exceed $T_{max}$. However rather than reduce the gain to zero suddenly when $T_{max}$ is reached, for instance by disabling the audio output stage, the gain is preferably gradually wound down allowing a graceful and less noticeable reduction in signal, but still fast enough relative to the thermal time constants of the speaker to avoid exceeding $T_{max}$. For instance the gain may decrease monotonically with temperature, at least over a range between a defined threshold temperature $T_{th}$ and $T_{max}$.

Figure 6:
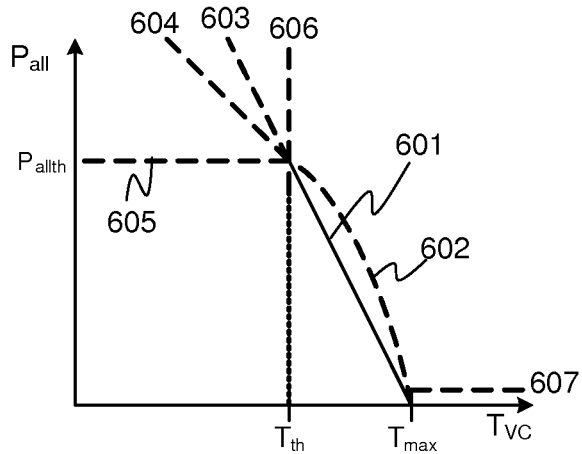
FIG. 6 illustrates one example of how allowed power may be controlled with voice coil temperature for a given reservoir temperature.

FIG. 6 illustrates an example of the transfer function between the temperature of the voice coil $T_{VC}$ and the allowed power Pall for determining the maximum allowed power dissipation $P_{all}$ in power limit block 501. The plot of $P_{all}$ with $T_{VC}$ shall be referred to herein as an allowed power curve. One possible form of the transfer function $f_p$ is a linear interpolation between a threshold value $P_{allth}$ at $T_{VC}=T_{th}$ to zero at $T_{max}$ as illustrated by solid line 601.

Alternatively a design may use a function with some convex curvature between these values such as illustrated by curve 602.

Below the threshold temperature $T_{th}$, the line or curve may just be continued continuously, e.g., according to line 603. In such an embodiment it will be appreciated that there is no threshold temperature as such, just a function defined over a complete anticipated range of temperature. This may lead to very high power levels being permitted by this block, but in practice this may be limited elsewhere in the system, e.g., by the finite input signal range, or the output stage's supply voltage, or some maximum current limit imposed by a speaker driver amplifier. In a different approach limiting may be applied across the whole temperature range but the local transfer function may vary above and below the temperature threshold, e.g., the gradient may change as indicated by line 604.

Alternatively, the power limit may be set to a first constant value $P_{allth}$ below the temperature threshold $T_{th}$, as illustrated by line 605, especially if the threshold temperature $T_{th}$ is a relatively low temperature compared to $T_{max}$ such that $P_{allth}$ is so high a power that it is rarely reached, or if the maximum power is desired to be limited for some non-thermal reason, for instance to avoid damage to the user's ears.

As a further alternative the maximum allowed power may not be limited at all below the threshold temperature $T_{th}$, as illustrated by line 606.

In some embodiments, rather than reduce the maximum allowed power to zero at $T_{max}$, $P_{all}$ may be set to a small second constant value, less than and possibly significantly less than that which is expected to cause any thermal problems, as indicated by line 607. This will allow the gain subsequently derived to be non-zero avoiding any complete suppression of signal. In some embodiments this may be desirable to ensure some minimum output speaker signal to allow ongoing coil resistance (i.e., temperature) monitoring. This minimum gain may also prevent noise etc. in the temperature measurement from consequently modulating the gain over a range which may be small on a linear scale but noticeable on a log scale and hence give rise to audible artifacts, although it will be appreciated that this could also be handled in the time-domain function, e.g., using some fixed time-out or similar. Maintaining a small but non-zero drive signal may also be useful to avoid unwanted operation of some downstream auto-mute function in the signal processing chain.

Figure 7:
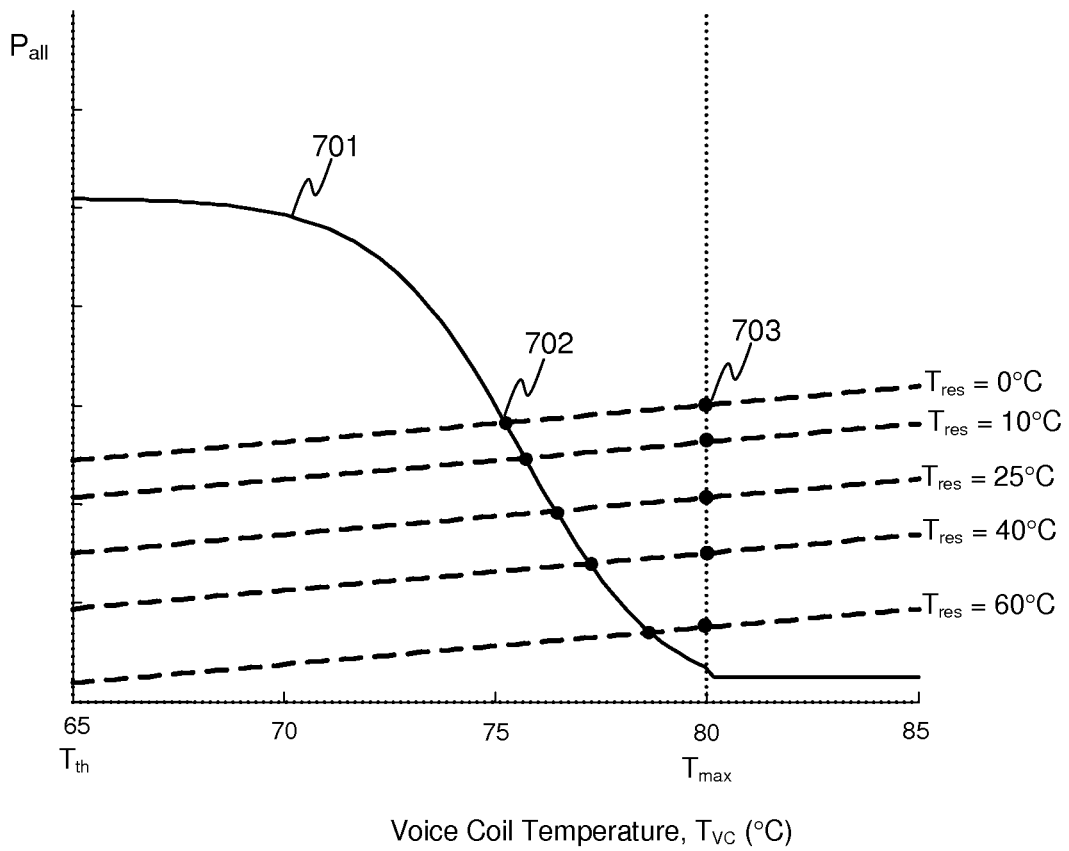
FIG. 7 illustrates another example of how allowed power may be controlled with voice coil temperature for a given reservoir temperature and also indicates how steady state power dissipation varies with reservoir temperature.

In addition to the linear and convex curves, an s-shaped curve can be used to transition between power levels as shown in FIG. 7. For example the transfer function or allowed power curve 701 could be defined, at least between the threshold temperature $T_{th}$ and the maximum temperature $T_{max}$ by a parametric curve such as:

$$P_{all} = \frac{a}{1 + b * c - T_{VC}}$$ (7)

where a, b and c are coefficients that control the flex point, the edges of the curve and its slope. Various other curves, for example polynomials, Bezier or spline curves could alternatively be used to define the variation in allowed power between at least the threshold temperature and the maximum temperature.

The advantage of the s-shaped or similar curve is to enable different behaviors of the thermal limiter, depending on whether the current temperature is closer to $T_{th}$ or to $T_{max}$, whilst allowing a smooth power transition as temperature changes.

It will therefore be appreciated that, at least when the gain of the gain element 103 of the signal processing chain is being modulated by the digital gain stage 103 in response to the controller 106, the power dissipated in the voice coil of the loudspeaker will be limited to the maximum allowed power limit $P_{all}$, such as defined by the maximum allowed power curve 701 illustrated in FIG. 7.

Consider for instance that the loudspeaker voice coil is driven continuously with a relatively high amplitude drive signal. Below the temperature threshold there may in effect be no power limiting and thus there may be a relatively significant amount of power dissipation in the voice coil, leading to heating of the voice coil. The voice coil temperature may increase until it reaches the temperature threshold $T_{th}$, say 65° C. for example. If the power dissipation continues the temperature of the voice coil may continue to increase. The allowed power dissipation may then be reduced leading to a gain modulation to reduce the drive signal supplied to the loudspeaker.

As noted above however the variation in temperature of the voice coil depends on the power dissipated $P_{VC}$ and the thermal resistance $R_{th}$ of the flow path to the thermal reservoir, e.g., the surrounding environment. Thus as long as the power dissipation is greater than a steady state value $P_{SS}$ given by $P_{SS}=(T_{VC}-T_{res})/R_{th}$ then the voice coil temperature will continue to increase. If however the power dissipation drops below this steady state level of power dissipation the voice coil temperature will start to drop as more heat flows to the reservoir than is dissipated due to the driving signal.

FIG. 7 illustrates how the steady state power dissipation $P_{SS}$ varies with temperature for a range of different reservoir temperatures, as indicated by the various dashed lines. It can be seen that the plot of steady state power dissipation will intersect with this particular allowed power curve at an intersection point 702 that varies with reservoir, i.e., ambient temperature.

If therefore a loudspeaker is being driven and gain modulation is applied as the threshold temperature is reached the power dissipated will be limited to the allowed power limit Initially the limited power dissipation will be above the steady state level and thus the voice coil will continue heating. As long as the input signal level does not drop significantly the temperature and power dissipated in the loudspeaker will thus follow the allowed power curve 701 with increasing temperature until the relevant intersection point 702 is reached. At this point the heat input to the voice coil by the power dissipation is matched by the heat flowing out towards the thermal reservoir and the voice coil temperature will thus stabilize at a constant temperature.

It can be seen however for this particular allowed power curve 701 the steady state power dissipation and thus the steady state voice coil temperature is reached at a temperature below the maximum allowed temperature $T_{max}$. FIG. 7 also shows the points of intersection 703 between the plots of steady state power dissipation and the maximum allowed temperature $T_{max}$. It can be seen that for each of the reservoir temperatures the intersection of the steady state power dissipation and this allowed power curve 701 occurs at a lower allowed power than would be the case at the maximum allowed temperature and it can further be seen that for this particular allowed power curve 701 the difference is greater with decreasing reservoir temperature. This illustrates that were an allowed power limit to be used independently of reservoir temperature, e.g., ambient temperature, the result would be that in at least some use cases a greater degree of power limiting may be applied than may be necessary to maintain the voice coil temperature within an acceptable limit.

Embodiments of the invention may thus vary the allowed power curve, i.e., the transfer function between voice coil temperature $T_{VC}$ and the allowed power limit $P_{all}$ based on an indication of reservoir temperature $T_{res}$, e.g., the estimated reservoir temperature. In some embodiments the allowed power curve is varied with reservoir temperature $T_{res}$ such that the steady state power dissipation leading to a steady state voice coil temperature corresponds to the maximum allowed temperature $T_{max}$.

The power limit block 501 may thus determine a suitable allowed power curve, i.e., a suitable transfer function $f_p(T_{VC})$ to be applied based on the estimated reservoir temperature $T_{res}$. In some embodiments the power limit block may comprise a series of stored transfer functions or allowed power curves to be applied at a given reservoir temperature or range of reservoir temperatures. In some embodiments however a transfer function may be adapted in a known way based on the reservoir temperature, for instance the various coefficients used to define the allowed power curve between the threshold and maximum temperature values may be adjusted based on the reservoir temperature. In some embodiments a look-up table or similar may simply contain an indication of the allowed power $P_{all}$ for a given voice coil temperature $T_{VC}$ and reservoir temperature $T_{res}$.

As mentioned the allowed power curves may be designed so that that the allowed power dissipation is substantially equal to a steady state power dissipation at the maximum allowed temperature. This may be notionally determined by the point of intersection of a plot of steady state power dissipation with the allowed power curve.

Figure 8:
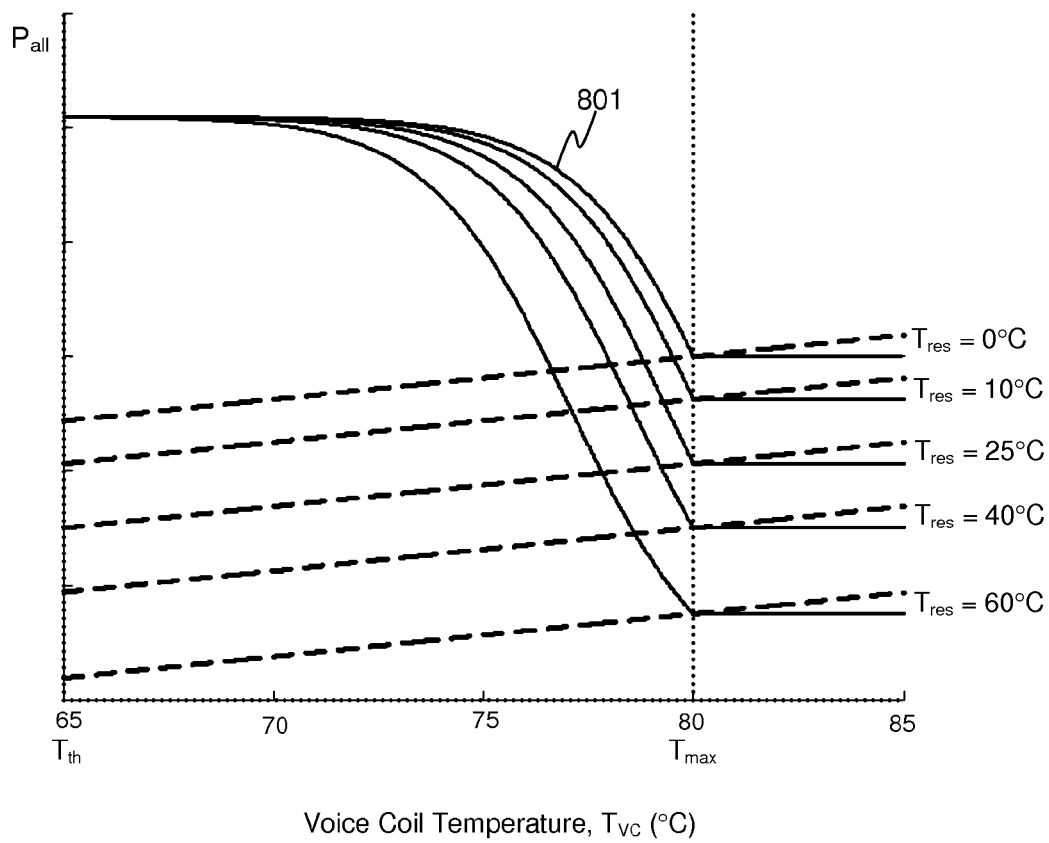
FIG. 8 illustrates a family of allowed power curves that may be applied at different reservoir temperatures.

FIG. 8 illustrates one example of a family of allowed power curves 801, i.e., transfer functions of voice coil temperature $T_{VC}$ with allowed power limit $P_{all}$ for a number of different reservoir temperatures. In each case the relevant allowed power curve is arranged to intersect with a plot of steady state power dissipation at the maximum allowed temperature $T_{max}$.

The steady state power dissipation will depend on the type of loudspeaker. The gradient of this plot with increasing voice coil temperature depends on the thermal resistance of the flow path for heat flow from the voice coil to the thermal reservoirs, with the reservoir temperature influencing the amount of offset. This will depend on the components of the loudspeaker but the thermal resistance may be similar for similar types of loudspeaker. The allowed power curves for the loudspeaker will thus be chosen for the particular loudspeaker or class of loudspeaker.

It should be noted that the allowed power limit may be defined based on heat flow to the surrounding environment and thus the reservoir temperature may be the ambient temperature and the thermal impedance model will model heat flow to the surrounding atmosphere. In some embodiments however, as noted above, the thermal reservoir may be identified as the magnet or some other loudspeaker component with a relatively high thermal capacity, which as noted above may simplify the thermal model used.

It can therefore be seen in FIG. 8 that the allowed power curves vary from a certain allowed power $P_{all-th}$ at the threshold temperature to an allowed power $P_{all-max}$ at the maximum temperature. The allowed power $P_{all-max}$ at the maximum temperature varies with the estimate of reservoir temperature and may be defined with respect to the steady state power dissipation at that reservoir temperature.

The allowed power at the threshold temperature may be chosen to ensure that any necessary gain reduction happens in time as the voice coil temperature increases to avoid overheating. In embodiments where no gain limiting is applied below the threshold temperature the allowed power at the threshold temperature may be chosen with a view to minimizing any audible artifacts due to sudden changes when the temperature threshold is reached.

If no power limiting is applied before the temperature threshold is reached then three different scenarios can be envisaged. First at the time that the voice coil temperature reaches the threshold temperature the present actual power dissipation may substantially correspond to the allowed power dissipation $P_{all-th}$. In this case there may initially be no gain reduction applied and, assuming a constant input signal, as temperature increases, an increasing gain reduction is applied so that the power dissipated $P_{VC}$ gradually decreases according to the power allowed curve, without any initial step. This is the optimal scenario because the thermal limiter becomes active exactly when expected, when the estimated voice coil temperature $T_{VC}$ reaches the threshold temperature $T_{th}$ and the resulting change in volume is inaudible.

It may be the case however that at the time that the threshold temperature is reached the actual power being dissipated in the voice coil $P_{VC}$ is greater than the allowed power limit, $P_{all-th}$. In this case there will be an initial reduction in gain which could be relatively abrupt and which could therefore result in an abrupt change in volume which is noticeable by a listener. This may be mitigated by using a relatively slow time constant for a change of gain but this could potentially reduce the ability of the loudspeaker protection circuitry to prevent overheating as the actual power dissipation could then remain above the allowed power limit for a relatively long period of time. Varying the time constant with voice coil temperature is possible but still runs the risk of overheating and/or an abrupt change of gain once the time constant becomes fast enough.

The third scenario is that the actual power dissipation is less than the allowed power limit at the point at which the voice coil temperature reaches the threshold temperature. In this instance at the point that the threshold temperature is reached there would be no need for any gain reduction and the power dissipation $P_{VC}$ is below the allowed limit $P_{all=th}$. In this case no gain reduction may be applied until the voice coil temperature reaches has increased such that the allowed power limit $P_{all}$ has dropped to the present power dissipation. The gain will then start to be reduced but in this case the gain changes may start to occur too late to prevent overheating if the voice coil temperature is near the maximum temperature at this point, especially if slow time constants are associated with a change in gain to avoid the abrupt changes discussed previously.

In some embodiments therefore the allowed power limit at a threshold temperature may also be varied based on an estimate of the power dissipation of the voice coil $P_{VC}$.

Thus for example if no power limiting is applied below a threshold temperature then when the threshold temperature is reached an allowed power curve may be defined that starts at the threshold temperature $T_{th}$ at an indication of the present power dissipation in the voice coil. This may for instance be the last estimated power dissipation value or the maximum of average of the last n estimated values. The allowed power curve may then be defined between the determined value of $P_{all-th}$ and an allowed power at the maximum temperature, i.e., $P_{all-max}$. As mentioned above the allowed power at the maximum temperature, i.e., $P_{all-max}$ may be arranged to vary depending on the estimate of reservoir temperature and in some embodiments may be set at a level that leads to a steady state power dissipation at the maximum temperature at the present reservoir temperature $T_{res}$.

Figure 9:
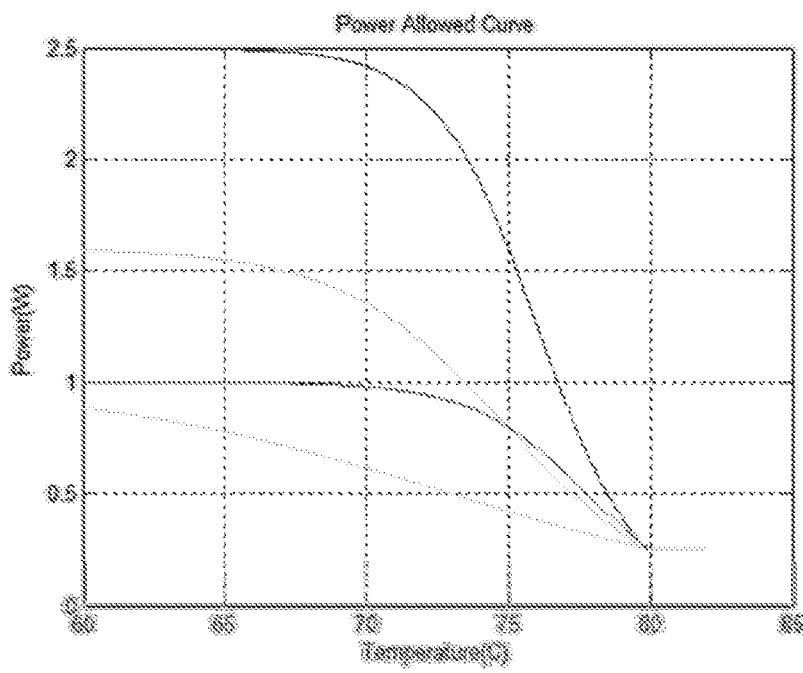
FIG. 9 illustrates how allowed power curves may be derived based on the present power dissipation when a threshold temperature is reached.

FIG. 9 illustrates how the defined allowed power curve may vary based on the estimate of voice coil power dissipation when the threshold temperature is reached. FIG. 9 illustrates how the allowed power curves for different starting power dissipation at one particular reservoir temperature. Any desired type of curve, e.g., linear, S-shaped, polynomial, can be used for the power allowed curve which may be defined based on the determined estimates of voice coil power dissipation $P_{VC}$ and reservoir temperature $T_{res}$. Alternatively, several predefined $P_{all}$ curves, with different ends point $P_{all-th}$ and $P_{all-max}$, can be stored in memory and the most appropriate curve can be derived from the available set and/or a curve derived by interpolation between stored curves.

It should be noted that the idea of defining an allowed power curve of allowed power against voice coil temperature where the allowed power at a threshold temperature varies with an indication of estimated power dissipation represents a further novel aspect of the invention. This aspect may be applied together with using an estimate of reservoir temperature to define the allowed power curve or transfer function or may in some examples be applied without an estimate of reservoir temperature. In such examples the starting point of the allowed power curve $P_{all-th}$ may thus vary with the estimate of power dissipation in the voice coil $P_{VC}$ but the allowed power at the maximum allowed temperature $P_{all-max}$ may be set with regard an assumed worst case ambient temperature.

One or more of the parameters for defining the transfer function, e.g., the allowed power curve, such as $P_{allth}$, $T_{th}$, and $T_{max}$ may be fixed in hardware or stored in a suitable non-volatile memory. Suitable values may be set in chip manufacture or in subsequent end-user device manufacturing. In some instances the control circuitry may be associated with the audio drive circuitry but may read one or more parameter values from a memory associated with the loudspeaker. In some embodiments at least some of these parameters may be configurable and may vary during use, for example controlled by a control input (not shown). For example if a temperature-independent value of $P_{allth}$ is used below the threshold temperature $T_{th}$ and this value is set at least partly for user ear protection, it may be set to decrease over time as the monitored period of exposure increases.

As mentioned the gain calculation block 502 receives the determined maximum allowed power level and determines the target gain $G_{tgt}$ based on the current estimated power dissipation according to a second transfer function $G_{tgt}=f_G(P_{VC}, P_{all})$.

FIG. 10 illustrates how the target gain value may be adjusted in accordance with the estimated power dissipation $P_d$ for different values of the maximum allowed power $P_{all}$. The target gain $G_{tgt}$ may be set to reduce from some nominal value $G_{nom}$ with increasing values of $P_{VC}$. The nominal gain value could be defined consistently with the gain of other elements of the system to provide the required gain between output power of the drive signal and the input audio signal, e.g., the digital input signal $D_{in}$. The nominal gain value may be regarded as unity if other gains in the signal processing chain are defined appropriately.

Figure 10A:
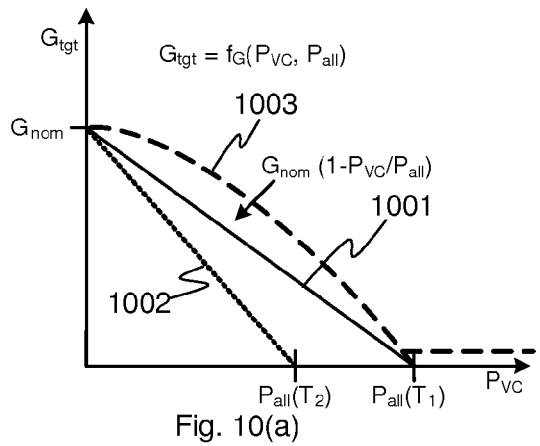
FIGS. 10a to 10e illustrate examples of how gain may be controlled based on the allowed power and an indication of the present power dissipation.

FIG. 10a illustrates that the target gain $G_{tgt}$ could be defined as a linear interpolation from a nominal gain $G_{nom}$ at zero power (or power dissipation below a threshold) to zero gain at $P_{all}$, i.e., $G_{tgt}=G_{nom} \cdot (1-P_{VC}/P_{all})$. Line 1001 illustrates this interpolation for a first value of $P_{all}$, i.e., at a first voice coil temperature $T_1$. If the temperature of the voice coil increases over time, to say $T_2$ then $P_{all}$ will decrease to $P_{all}(T_2)$. This will lead to a steeper gradient in the decrease from $G_{nom}$ to zero as illustrated by curve 1002.

Instead of a linear interpolation between $G_{nom}$ and zero (for a given value of $P_{all}$) a more aggressive curve with convex curvature could be employed to allow more power at intermediate temperatures, as illustrated by curve 1003. For example a transfer function of the form $G=G_{nom} \cdot \sqrt{(1-P_{VC}/P_{all})}$ could be used to give a linear interpolation of power gain rather than voltage gain.

If the value of $P_{all}$ is at a maximum value, for instance $P_{all\text{-}th}$, the gain adjustment may just be disabled, i.e., set to the nominal value $G_{nom}$. In effect this means that the target gain is set to its nominal or maximum value, for voice coil temperatures which are less than the threshold temperature, i.e., when $T_{vc} < T_{th}$.

The gain curves illustrated in FIG. 10a render it impossible to drive the voice coil to dissipate in excess of $P_{all}$: a near-infinite amplitude input signal would be attenuated by an almost-zero gain to limit the power to $P_{all}$. However this means that in practice the power will be limited to significantly less than $P_{all}$ for any realistic input signal.

Figure 10B:
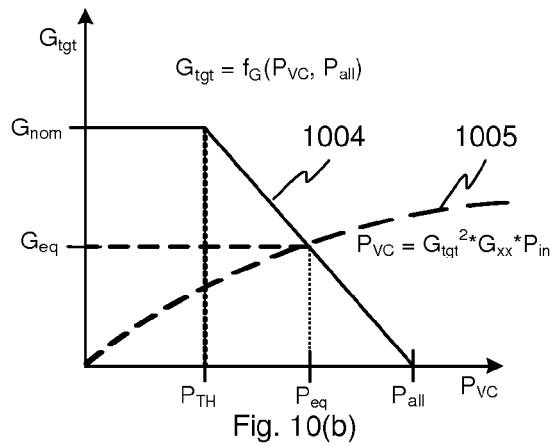

FIG. 10b illustrates a modulation of the target gain $G_{tgt}$ which applies a nominal gain $G_{nom}$ for power dissipation below a threshold $P_{TH}$ and then linearly decreases to zero at the maximum allowed power $P_{all}$. This is represented by the gain control plot 1004. FIG. 10b also illustrates however that the actual voice coil power dissipation for a given input signal will depend parabolically on the applied voltage gain modulation $G_{tgt}$, as illustrated by curve 1005 which shows how the dissipated voice coil power $P_{VC}$ varies with target gain value for a constant input signal power $P_{in}$, e.g., $P_{VC}=G_{tgt}^2 \cdot G_{xx} \cdot P_{in}$. Thus for a given input signal, the system will settle at an equilibrium gain $G_{eq}$ and power dissipation $P_{eq}$ corresponding to the intersection of this curve 1005 with the plot 1004 representing the designed dependence of gain on estimated power dissipation. The maximum power delivered may thus be substantially less than $P_{all}$.

Figure 10C:
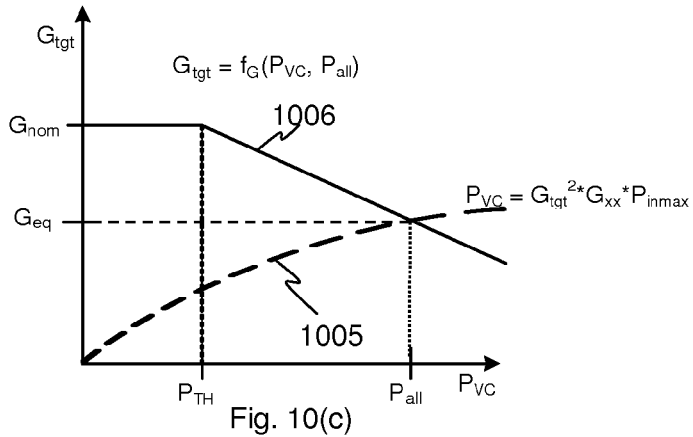

In some embodiments therefore, as illustrated in FIG. 10c, the gain control transfer function may be designed such that the applied gain $G_{tgt}$ is not zero, but instead is some value $G_{eq}$ consistent with attenuating the output power dissipation to equal or less than $P_{all}$ for even the maximum possible input signal (generally limited by the dynamic range of upstream circuitry, or in some embodiments may be subject to controlled clipping) and the maximum gain $G_{xx}$ applied in the rest of the signal path. FIG. 10c thus shows that the target gain $G_{tgt}$ may vary according to a transfer function, illustrated by plot 1006, such that the gain is at the nominal value if the power dissipation is below a threshold and then varies, linearly in this example, to the value $G_{eq}$ at $P_{all}$. The value of $G_{eq}$ is defined with respect to the power dissipation of the maximum possible input signal $P_{inmax}$ and the gains along the signal processing chain. Thus if the input signal is the maximum possible the target gain may be reduced until the target gain is at a level that ensures that the voice coil power dissipation $P_{VC}$ is substantially equal to (or just below) the maximum allowed power dissipation $P_{all}$.

Figure 10D:
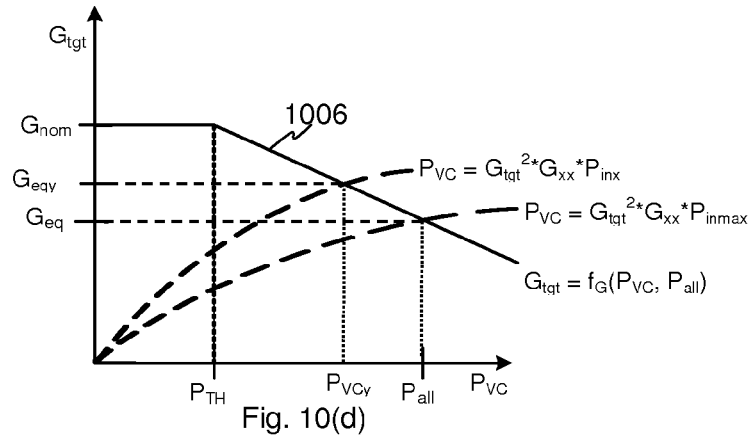
Figure 10E:
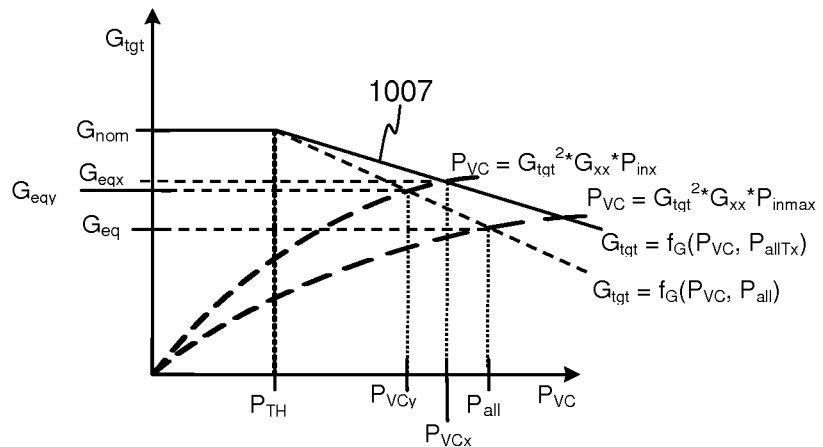

As illustrated in FIG. 10d, if a smaller signal than the maximum $P_{inmax}$ is applied, then the actual dissipated power for a given target gain will be lower than would be the case for the maximum input signal. Thus the intersection between the gain control function 1006 and the relationship of dissipated power with target gain would be at a target gain $G_{eqy}$, corresponding to a power dissipation $P_{VCy}$, which would be lower than the maximum allowed power $P_{all}$. However the reduced output power $P_{VCy}$ will tend to lead to a reduction in the voice coil temperature, which will tend to result in an increased value of $P_{all}$, say $P_{allTx}$, resulting in a change in the gain control transfer function, as illustrated by plot 1007 in FIG. 10e. The target gain and output power will thus tend to increase to a new equilibrium point $(G_{eqx}, P_{VCx})$ closer to the original $P_{all}$.

For simplicity the gain control curve has been illustrated as a linear voltage gain versus power dependence. As noted above with respect to curve 1003 in FIG. 10a, other dependencies are possible, for instance the voltage gain may vary as the reciprocal of the estimated power dissipation or as the square root of the reciprocal. The dependency may alternatively follow some S-shape characteristic.

It will again be appreciated that changes in the power dissipated can occur over relatively quick timescales and can occur faster than the time constant of temperature change of the voice coil or magnet. Thus for rapid changes of the dissipated power the value of $P_{all}$ may be substantially unchanging and thus the particular target gain vs. dissipated power function will be substantially fixed. Over a longer timescale however the voice coil temperature may change and thus the particular gain vs. power profile may also vary. This could lead to a change in gain being applied sometime after the input signal level has stabilized.

It will be appreciated that the discussion with reference to FIGS. 10a to 10e has focused on generating a gain control value which is a target gain setting for thermal protection, i.e., a value corresponding to the gain to be applied. Thus the target gain drops with increasing values of power dissipation $P_{VC}$. Equivalently however the gain control value could be a gain modulation value, indicating the magnitude of the modulation to the nominal gain setting, which would increase with power dissipation.

It can therefore be seen that in general the speaker protection module of embodiments of the present invention generates a control signal for modulating the gain applied to an input audio signal used to drive a loudspeaker based on a measure or estimate of the present voice coil temperature of the loudspeaker, an indication of the power dissipation in the loudspeaker and also an indication of the temperature of a thermal reservoir to which heat generated in the voice coil flows. The gain applied may vary in accordance with changes in the power dissipated in the loudspeaker (at least with a range of expected operating temperature) and the amount of change of gain resulting from a given change in power dissipation depends on the voice coil temperature (via the $P_{all}$ dependence).

The indication of the temperature of a thermal reservoir may be determined or estimated using a suitable thermal impedance model as described above, e.g., by estimation of the voice coil temperature and changes in the voice coil temperature with power dissipation. However it would be possible to determine the indication of reservoir temperature via some suitable temperature sensor, which may also be used for other monitoring purposes, and adjust the allowed power based on a measure of reservoir temperature.

It should be noted that gain factors described above are defined as voltage gain factors, suitable for applying to the signal as a simple multiplication, rather than power gain (i.e., the square of a voltage or digital signal gain) even though defined with respect to a power variable. In some embodiments the gain control signal may be generated as a non-linear gain value, for example representing the required gain in decibels or such like coupled to a gain stage 103 configured suitably.

In some embodiments the gain control for thermal protection may be combined with a gain control applied for user volume control. Thus gain element 103, e.g., a digital multiplier, may be arranged to apply a gain modulation to the input signal that applies any user volume controller gain along with any gain modulation for thermal protection (and/or any other required gain modulation such as for excursion limiting or ear protection). The gain controller 106 may therefore also receive an additional gain control signal, such as a user volume control signal. In some embodiments the nominal gain value $G_{nom}$ may be modulated by such a user volume control signal to become a new value $G_{adj}$. This may scale the whole characteristic vertically such that the gain is maintained at $G_{adj}$ until the threshold $_{Pall-th}$ is reached and then reduced down to zero (or to the defined small non zero level) at some maximum value $P_{all-max}$. In some embodiments however the gain may be maintained equal to $G_{adj}$ until it intercepts the previous nominal interpolation function thus avoiding the need for any signal attenuation until higher power levels.

As mentioned above a gain control block 503 may apply some time-domain processing on the target gain signal to improve the implementation of the required gain change. It will be appreciated that a change in gain could in some instance lead to an audible artifact in the audio and the time-domain processing may aim to reduce or eliminate such artifacts.

Such time domain processing may include zero-crossing detection of the input signal $D_{in}$. For instance gain changes may only be applied when the input signal crosses zero to avoid steps introduced by gain changes applied to a non-zero part of the signal.

The time domain processing may additionally or alternatively comprise applying decay time constants to limit the rate of change of any gain reductions applied to the signal so as to reduce any audible artifacts. Such decay time constants may be longer than audio signal time constants but shorter than any thermal time constants.

The time domain processing may additionally or alternatively comprise applying attack time constants to limit the rate of change of any gain increases applied to the signal, e.g., as the voice coil cools down following a reduction in the amplitude of the drive signal (possibly due to a reduced input signal and/or a reduction in gain being applied). Such attack time constants may be longer than audio signal time constants. They may be longer than at least one of the thermal time constants. This may reduce possible thermal oscillations and consequent unnecessary or avoidable gain modulations. As noted above however using an estimate of the present power dissipation $P_{VC}$ to define an allowed power curve may reduce the likelihood of an abrupt change in gain that may be noticeable to a listener whilst reducing the need for slow attack time constants that may increase the risk of overheating.

As noted briefly above such gain profile could be variable and change, for example, based on the current voice-coil temperature. For instance, if the temperature of the voice-coil increases and exceeds the threshold temperature $T_{th}$ because of a signal being applied to the speaker, the thermal limiter, i.e., the loudspeaker protection system, will start to apply a gain reduction to reduce the output power. Initially the thermal limiter can be configured to use a relatively long attack time so as to apply a relatively gradual change in signal level as the temperature crosses $T_{th}$. However if the voice-coil temperature continues to rise above $T_{th}$ and is approaching $T_{max}$, a fast attack time can be implemented to ensure that the power dissipation is reduced more quickly so as to prevent the temperature from exceeding the maximum allowed level. A similar approach can be used to set different hold and release times.

By using variable time constants, it is possible to satisfy the requirements of protection, whilst at the same time maximizing loudness and reducing the chance of gain changes resulting in a noticeable jump in sound level. While in a safer temperature zone, the attack times can be slower and the release faster to maximize the output power while reducing the perceived gain variation. If the temperature is closer to $T_{max}$, the attack can be faster and the release slower to guarantee that only the allowed amount of power is driven into the system.

Additionally or alternatively the gain control 503 may be arranged to apply time-outs or minimum intervals between gain updates, to limit the maximum frequency of gain changes and hence any audio artifacts.

As mentioned above if there is no or little output power it may be difficult to obtain an accurate estimate of coil temperature, in which case a time-out may be imposed before the gain is recovered enough to obtain a revised temperature estimate.

As mentioned above, the various parameters of the power limit block 501 may be fixed in hardware or stored in memory and/or may be configurable in use. Likewise the parameters of the gain calculation block and gain control block may similarly be fixed in hardware or non-volatile memory and may be set in chip or end-user device manufacturing. One or more parameters may vary during use, e.g., controlled by a further control input. The calculation of functions $f_P$, $f_G$ may be implemented via look-up tables or by customized or programmable processing hardware implementing the desired algebraic formulae.

It will be appreciated by one skilled in the art that the loudspeaker protection control module 104 may be implemented by dedicated electronic circuit components and/or by various processing elements such as a general purpose programmable digital processor or FPGA array or the like suitably programmed. For example the power and temperature extraction block 105 and/or the controller 106 may be implemented, at least partly, as software modules running on a suitable processor. The term modules and block should therefore be read as covering both software modules or hardware modules or a mixture of both software and hardware. Any references to circuitry for these components could also mean suitable general processing circuitry.

Figure 11A:
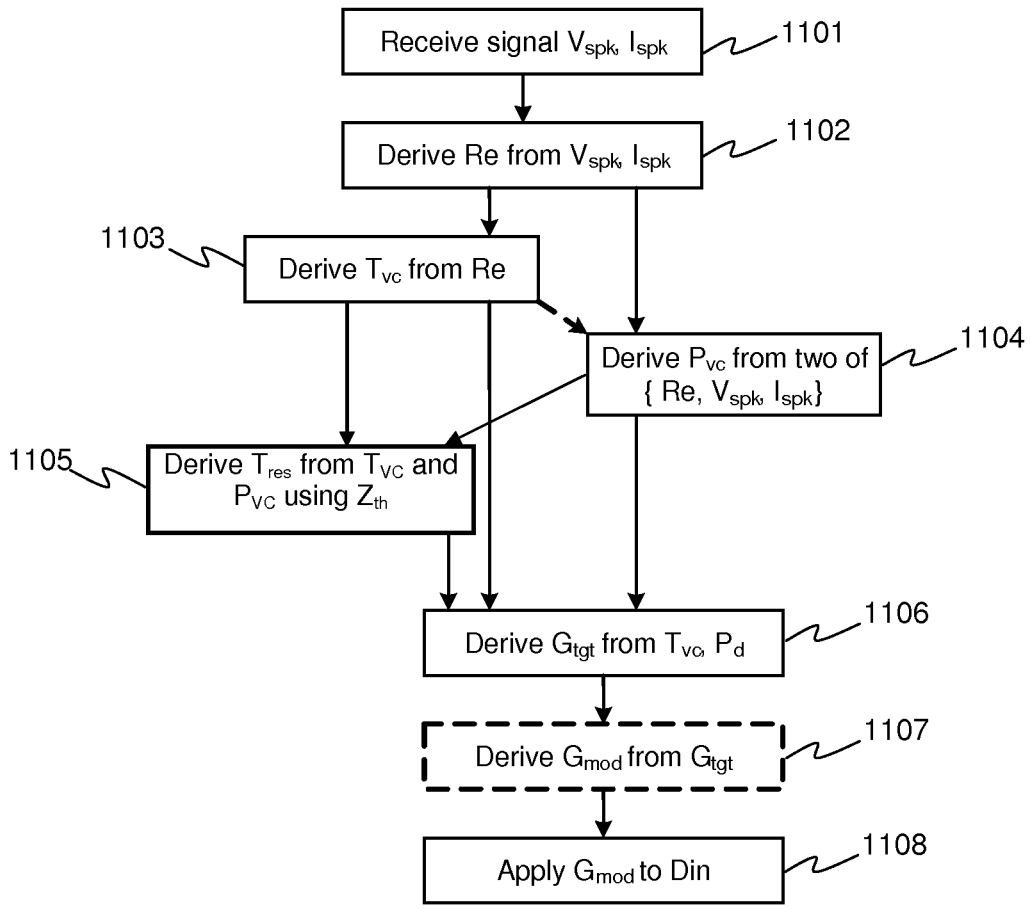
FIGS. 11a and 11b illustrate flow charts of methods according to embodiments of the invention.

FIG. 11a shows a flow diagram illustrating the general method implemented by some embodiments of the invention such as described above. At step 1101 a loudspeaker protection control module receives signals $V_{spk}$ and $I_{spk}$ indicative of the monitored voice coil drive voltage $V_{spka}$ and voice coil current $I_{spka}$. The loudspeaker protection control module 104, at step 1102, derives an indication or estimate of the resistance voice coil resistance Re. At step 1103 an estimate $T_{VC}$ of the voice coil temperature is derived from the estimated voice coil resistance Re. At step 1104 an estimate $P_{VC}$ of the present power dissipation of the loudspeaker, is derived from the indicative voltage and current signals $V_{spk}$ and $I_{spk}$ (or optionally from at least one of these signals and also the estimated voice coil resistance Re). At step 1105 an estimate of a thermal reservoir temperature $T_{res}$, e.g., a thermal reference or ambient temperature, is derived from $T_{VC}$ and $P_{VC}$ in conjunction with a thermal impedance model $Z_{th}$.

A target gain control value may then be derived (step 1106) based on the voice coil power dissipation estimate $P_{VC}$ and the voice coil temperature estimate $T_{VC}$ and the reservoir temperature estimate $T_{res}$. This target gain control value may be used directly as a gain control signal or optionally, at step 1107 additional processing may derive a gain control signal $G_{mod}$. The gain control signal may then be applied to the input signal (step 1108).

Figure 11B:
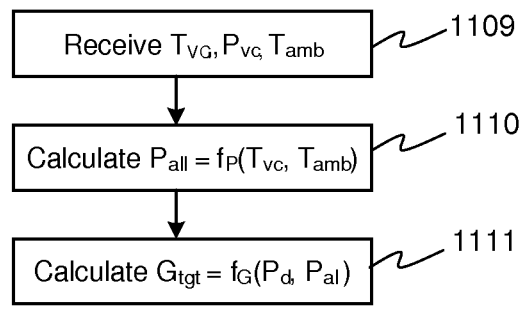

FIG. 11*b* shows a flow chart illustrating some of the processing that may be applied in calculating the target gain. At step 1109 the voice coil power dissipation estimate $P_{VC}$ and the voice coil temperature estimate $T_{vc}$ and the ambient temperature estimate $T_{amb}$ are received. At step 1110 an allowed maximum power $P_{all}$ is derived based on a defined function $f_p(T_{VC}, T_{res})$. The allowed power $P_{all}$ is then used together with the voice coil power dissipation estimate $P_{VC}$ to derive a target gain $G_{tgt}$ (step 1111)

Figure 12:
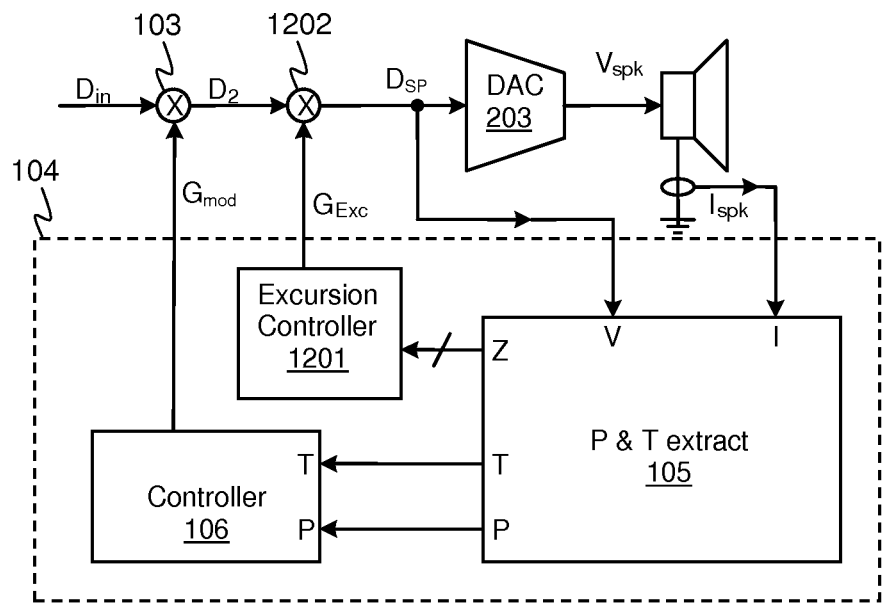
FIG. 12 illustrates speaker driver circuitry comprising another embodiment of a thermal limiter.

In some applications it may be desirable to determine an indication of the loudspeaker voice coil resistance and/or an indication of a reservoir temperature, e.g., an ambient temperature for other reasons. For example an estimate of impedance may be useful; for limiting the excursion of the loudspeaker. Thus at least some blocks of the power and temperature extraction block 105 may be shared with other elements of speaker protection circuitry, for example an impedance extraction block 202 such as described with respect to FIG. 2. FIG. 12 illustrates an embodiment of the invention where similar components to those described above are identified using the same reference numerals but where the protection module 104 also comprises an excursion controller 1201 for controlling an additional gain element 1202 in the signal processing chain.

A power and temperature extraction block 105 receives an indication of the voice coil current and the drive signal voltage (conveniently receiving the digital input signal $D_{SP}$ input to the DAC output stage 203) as described previously. This block will determine, i.e., calculate, an estimate of the coil resistance as described above and also determine power dissipation of the voice coil and estimates of the voice coil and reservoir temperatures. The power and temperature estimates are provided to thermal protection controller 106 to generate a gain modulation signal $G_{mod}$ as described previously. In this embodiment however an impedance extraction block of the power and temperature extraction block 105 also extracts other impedance parameters of the voice coil for use in excursion limiting circuitry. It will be appreciated that coil impedance varies depending on temperature and on its position with respect to the magnet etc. Excursion controller therefore receives an indication of the coil impedance and determines an appropriate gain to be applied to the audio signal by gain element 1202 to limit the excursion of the loudspeaker to within safe bounds.

It would of course be possible to integrate excursion controller 1201 and thermal protection controller 106 in a single functional block and in some embodiments a single gain control signal may be produced and used to control a single gain element.

Embodiments have been described above in relation to a protection module for one output speaker. Other embodiments may comprise a protection module for a plurality of output speakers, which may all receive the same input signal or in some embodiment there may be a plurality of different input signals. The protection module be configured to treat each input signal as an independent channel, or gains may be ganged, so that all gains are reduced together, based on the worst case channel Since actual output powers and coil temperatures are used, there is no need to assume ultra-safe values for thermal time constants etc. so less margin is needed, and each speaker can drive closer to its safe operating limits. For example if one speaker has poor thermal resistance, it would only be necessary to limit the input signals if that particular speaker is receiving a large signal.

Embodiments of the invention therefore relate to speaker protection circuitry for thermal protection of a loudspeaker, in particular to limit the voice coil temperature within safe limits by modulating the gain of the drive signal when required. In embodiments the circuitry calculates, i.e., determines, both an estimate of the power being dissipated in the loudspeaker and the present voice coil temperature to determine an acceptable power limit and reduces the gain of the drive signal based on the relative level of present power dissipation and the acceptable power limit where the acceptable power limit is determined based on an estimate of the temperature of a reservoir for heat generated in the voice coil.

Figure 13:
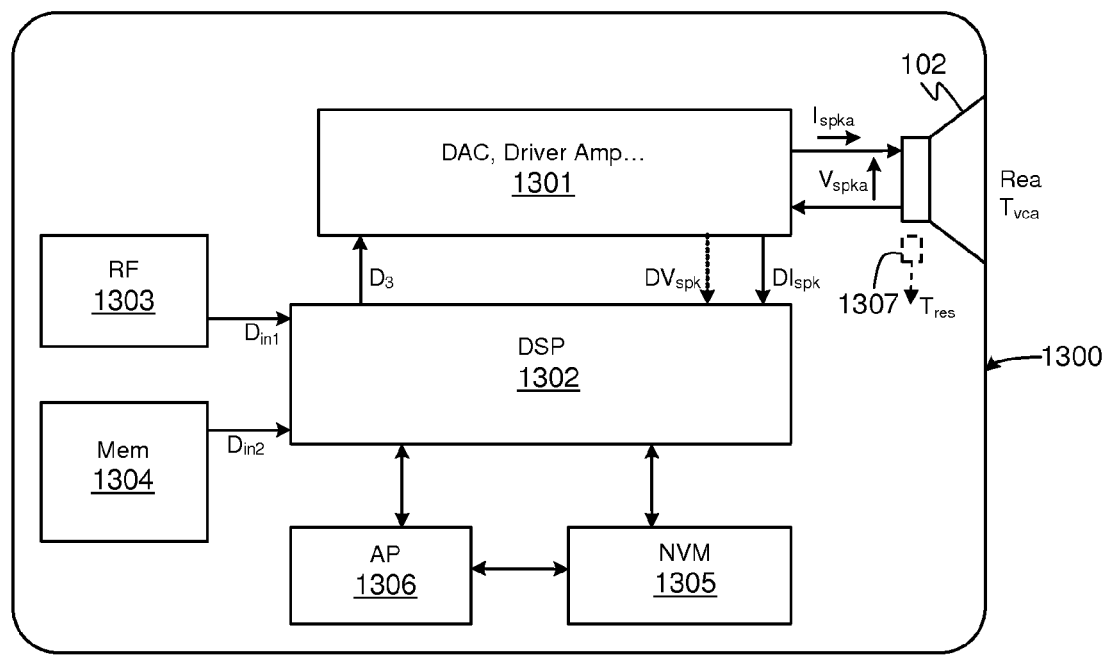
FIG. 13 illustrates an apparatus having a loudspeaker protection module for thermal limiting.

Such speaker protection circuitry may be implemented in an electronic apparatus or device 1300 as illustrated in FIG. 13, for example a mobile phone. This device comprises a loudspeaker 102 which is driven from a driver circuit block 1301, which forms at least part of the signal processing chain 101. The driver circuit block 1301 receives a digital audio signal $D_3$ and delivers a resultant voltage $V_{spka}$ across the speaker.

This driver circuit block 1301 may comprise a DAC (possibly oversampled e.g., delta-sigma) and analogue amplifier powerful enough to drive the impedance of the speaker. Alternatively it may comprise a Class D amplifier, either half-bridge or full-bridge, with an analogue input from a DAC, or possibly an all-digital Class D modulator. The driver signal processing chain may also possibly include analogue signal processing.

The speaker current $I_{spka}$ is monitored to provide a signal representative of this current. An analogue current sense signal may be generated by a sense resistor which may be local to the speaker (possibly buffered locally) or co-located with the amplifier. The amplifier may be inside the speaker package or may be a more remote power amplifier, either discrete or embedded in a more complex codec. As an alternative to a sense resistor the voltage across a MOS output transistor may be sensed to measure the current. Whilst an analogue signal for the speaker current could be provided, in some embodiments it may be preferred to provide a digital signal $DI_{spk}$ indicative of the sensed current. The sense buffer/digitizing circuitry may therefore be provided as part of the local speaker driver chip 1301. Note that where a sense resistor or the like is used for current monitoring there may be a need for some room-temperature electrical calibration of the temperature-sense resistor. Such calibration would however be rapid, of the order of milliseconds and such calibration does not require the long time constants associated with trying to determine thermal resistance from temperature versus power measurements.

The digital speaker current signal $DI_{spk}$ is provided along with a digital signal $DV_{spk}$ representative of $V_{spka}$. Where the driver circuit 1301 includes analogue processing the driver circuit may include an ADC to deliver the signal $DY_{spk}$, but in many cases $D_3$ will already be an adequate indicative signal.

A digital signal processing (DSP) 1302 block implements the speaker protection control module. The DSP block 1302 may receive a digital input audio signal $D_{in}$ intended for the speaker 102. This could for example be an audio signal $D_{in1}$ received from an interface 1303, for instance an RF radio/wireless interface or modem which could for example be received audio for a voice/video call and/or streaming media. At other times the input could be an audio signal $D_{in2}$ which may be received from some data storage 1304, for instance disk storage, either mechanical or solid-state, or some other semiconductor memory. This storage may be a permanent part of device 1300 or may be attachable storage such as a memory card or USB stick or suchlike. The DSP 1302 includes a gain stage to apply gain to the input signal $D_{in}$ and also possibly further DSP or multiplier blocks to perform further signal processing to generate the digital signal $D_3$ supplied to the driver block 1301.

The speaker protection control module may be implemented by software code running on the DSP 1302.

This software code may be stored in the device as firmware on some non-volatile memory 1305 e.g., EEPROM (to preserve program data when the battery becomes discharged or is removed for replacement.

The relevant software for running the loudspeaker protection module may be loaded into the DSP on power-up, which could be for example awaking of the device 1300 from a standby mode, or on start-up of the speaker driver function, e.g., on receipt of user command to start outputting sound via the loudspeaker.

A separate processor, for example an applications processor, AP, or processor core 1306 may control this start-up. In some applications at least some audio data (e.g., ring tone, pre-recorded voice alert or the like) may be provided from the NVM 1305, either directly or via processor AP 1306.

As mentioned previously in some embodiments the speaker protection control module may determine the resistance of the voice coil based on a reference voice coil resistance which could be determined on device start-up. As also mentioned previously in some embodiments a temperature sensor 1307 may be associated with the loudspeaker and/or host device to provide an indication of reservoir temperature $T_{res}$.

It will of course be appreciated that the various blocks illustrated in FIG. 13 or parts thereof may be co-integrated with the other blocks or parts thereof or with other functions of the host device. For example the DSP 1302 and driver block 1301 may be co-integrated into an Audio Hub.

The skilled person will thus recognize that some aspects of the above-described apparatus and methods, for example the calculations performed by the processor may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware Embodiments of the invention may be arranged as part of an audio processing circuit, for instance an audio circuit which may be provided in a host device. A circuit according to an embodiment of the present invention may be implemented as an integrated circuit. One or more loudspeakers may be connected to the integrated circuit in use.

Embodiments may be implemented in a host device, especially a portable and/or battery powered host device such as a mobile telephone, an audio player, a video player, a PDA, a mobile computing platform such as a laptop computer or tablet and/or a games device for example. Embodiments of the invention may also be implemented wholly or partially in accessories attachable to a host device, for example in active speakers or headsets or the like.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope. Terms such as amplify or gain include possibly applying a scaling factor of less than unity to a signal.

What is claimed is:

1. A system for thermal protection of a loudspeaker comprising:
    a controller configured to generate a control signal for modulating the gain of a signal processing chain driving said loudspeaker,
    wherein said controller is configured such that the control signal is generated as a function of each of:
        an indication of voice coil temperature of the loudspeaker;
        an indication of power dissipation in the voice coil of the loudspeaker; and
        an indication of a reservoir temperature of a thermal reservoir for heat flow from the voice coil, and
    wherein the controller is configured to receive a signal obtained by monitoring a voltage applied to the loudspeaker and a signal obtained by monitoring a current in the loudspeaker,
    wherein the controller is configured to use said received signals to obtain at least one of the indication of voice coil temperature of the loudspeaker, the indication of power dissipation in the voice coil of the loudspeaker, and the indication of a reservoir temperature of a thermal reservoir for heat flow from the voice coil, and
    wherein the controller comprises:
        a power limit module configured to determine an allowed power function of an allowed power dissipation with voice coil temperature based on said indication of a reservoir temperature; and
        a gain calculation module configured to determine a gain setting based on the indication of power dissipation in the voice coil and the allowed power function, and
    wherein said control signal is based on said gain setting.

2. A system as claimed in claim 1 comprising an estimation module configured to determine said indication of reservoir temperature based on said indication of power dissipation of the voice coil.

3. A system as claimed in claim 1 wherein the indication of a reservoir temperature is an indication of an ambient temperature for the loudspeaker.

4. A system as claimed in claim 1 wherein the indication of a reservoir temperature is an indication of the temperature of a component of the loudspeaker other than the voice coil.

5. A system as claimed in claim 1 comprising a gain element for applying a gain to the input signal, said gain element being controlled by said controller wherein said controller controls the gain of said gain element based on said control signal and at least one other gain setting.

6. A system as claimed in claim 1 wherein said controller further comprises an excursion limiting module configured to generate a second gain setting for excursion limiting of the loudspeaker.

7. An electronic apparatus comprising a system as claimed in claim 1.

8. A system as claimed in claim 1 wherein the power limit module is configured to determine the allowed power function such that the allowed power dissipation at a maximum allowed temperature of the voice coil depends on said indication of a reservoir temperature.

9. A system as claimed in claim 8 wherein the power limit module is configured to determine the allowed power function such that the allowed power dissipation at the maximum allowed temperature corresponds to a power dissipation that leads to a substantially steady state temperature of the voice coil at the relevant reservoir temperature.

10. A system as claimed in claim 1 wherein the power limit module is configured to determine the allowed power function for a voice coil temperature range between a threshold temperature and said maximum allowed temperature.

11. A system as claimed in claim 10 wherein the power limit module is configured to determine the allowed power function such that for any voice coil temperature below a the threshold temperature no limit on allowed power is applied.

12. A system as claimed in claim 10 wherein the power limit module is configured to determine the allowed power function such that the allowed power dissipation at the threshold temperature is based on said indication of power dissipation in the voice coil of the loudspeaker.

13. A system as claimed in claim 1 wherein the gain calculation module is configured to determine the gain setting based on an allowed power dissipation determined according to the allowed power function and the indication of power dissipation in the voice coil according to a gain control transfer function,
wherein the gain control transfer function varies the gain setting from a first gain setting at a first value of power dissipation in the voice coil of the loudspeaker to a second gain setting at a second value of power dissipation in the voice coil, wherein the first gain setting corresponds to a maximum gain setting and the second gain setting corresponds to a lower gain setting, and
wherein the second value of power dissipation in the voice coil corresponds to the allowed power dissipation and the second gain setting corresponds to a gain setting that would lead to a power dissipation substantially equal to the allowed power dissipation if an input signal to the signal processing chain driving said loudspeaker was at a maximum level.

14. A system for thermal protection of a loudspeaker comprising:
a controller configured to generate a control signal for modulating the gain of a signal processing chain driving said loudspeaker,
wherein said controller is configured such that the control signal is generated as a function of each of:
an indication of voice coil temperature of the loudspeaker;
an indication of power dissipation in the voice coil of the loudspeaker; and
an indication of a reservoir temperature of a thermal reservoir for heat flow from the voice coil,
wherein the controller comprises:
a power limit module configured to determine an allowed power function of an allowed power dissipation with voice coil temperature based on said indication of a reservoir temperature; and
a gain calculation module configured to determine a gain setting based on the indication of power dissipation in the voice coil and the allowed power function,
wherein said control signal is based on said gain setting.

15. A system as claimed in claim 14 wherein the power limit module is configured to determine the allowed power function such that the allowed power dissipation at a maximum allowed temperature of the voice coil depends on said indication of a reservoir temperature.

16. A system as claimed in claim 15 wherein the power limit module is configured to determine the allowed power function such that the allowed power dissipation at the maximum allowed temperature corresponds to a power dissipation that leads to a substantially steady state temperature of the voice coil at the relevant reservoir temperature.

17. A system as claimed in claim 14 wherein the power limit module is configured to determine the allowed power function for a voice coil temperature range between a threshold temperature and said maximum allowed temperature.

18. A system as claimed in claim 17 wherein the power limit module is configured to determine the allowed power function such that for any voice coil temperature below a the threshold temperature no limit on allowed power is applied.

19. A system as claimed in claim 17 wherein the power limit module is configured to determine the allowed power function such that the allowed power dissipation at the threshold temperature is based on said indication of power dissipation in the voice coil of the loudspeaker.

20. A system as claimed in claim 14 wherein the gain calculation module is configured to determine the gain setting based on an allowed power dissipation determined according to the allowed power function and the indication of power dissipation in the voice coil according to a gain control transfer function,
wherein the gain control transfer function varies the gain setting from a first gain setting at a first value of power dissipation in the voice coil of the loudspeaker to a second gain setting at a second value of power dissipation in the voice coil, wherein the first gain setting corresponds to a maximum gain setting and the second gain setting corresponds to a lower gain setting, and
wherein the second value of power dissipation in the voice coil corresponds to the allowed power dissipation and the second gain setting corresponds to a gain setting that would lead to a power dissipation substantially equal to the allowed power dissipation if an input signal to the signal processing chain driving said loudspeaker was at a maximum level.

21. A system as claimed in claim 14 wherein said controller comprises a gain control module configured to apply time domain processing to said gain setting to provide control signal.

22. A system as claimed in claim 21 wherein said time domain processing comprises applying at least one of an attack time constant and a decay time constant to said gain control value to generate said control signal and wherein the gain control module is configured such that at least one of the attack time constant and a decay time constant is variable based on the indication of voice coil temperature.

23. A system for thermal protection of a loudspeaker comprising:
a controller configured to generate a control signal for modulating the gain of a signal processing chain driving said loudspeaker,
wherein said controller is configured such that the control signal is generated as a function of each of:
an indication of voice coil temperature of the loudspeaker;
an indication of power dissipation in the voice coil of the loudspeaker; and
an indication of a reservoir temperature of a thermal reservoir for heat flow from the voice coil,
further comprising an estimation module configured to determine said indication of reservoir temperature based on said indication of power dissipation of the voice coil,
wherein the estimation module comprises:
a temperature rise module configured to determine an estimated temperature rise based on the indication of power dissipation of the voice coil and a thermal impedance model of a thermal path between the voice coil and the thermal reservoir; and
a reservoir temperature estimation module configured to determine the indication of reservoir temperature based on the indication of voice coil temperature and the estimated temperature rise.

24. A system for thermal protection of a loudspeaker comprising:
a controller configured to generate a control signal for modulating the gain of a signal processing chain driving said loudspeaker,
wherein said controller is configured such that the control signal is generated as a function of each of:
an indication of voice coil temperature of the loudspeaker;
an indication of power dissipation in the voice coil of the loudspeaker; and
an indication of a reservoir temperature of a thermal reservoir for heat flow from the voice coil;
further comprising an estimation module configured to determine said indication of reservoir temperature based on said indication of power dissipation of the voice coil,
wherein the estimation module comprises at least one input for receiving a first signal indicative of voltage applied to the voice coil of said loudspeaker and a second signal indicative of current flowing in said voice coil and is configured to determine said indication of temperature of the voice coil and said indication of power dissipation in the voice coil based on said first and second signals; wherein at least said indication of voice coil temperature of the loudspeaker is based on an estimate of resistance of said voice coil which is determined based on said first and second signals.

25. A system as claimed in claim 24 wherein said estimation module is configured to determine said estimate of voice coil resistance based on:
the difference between the value of said estimated voice coil resistance and a reference resistance value at a known temperature; and
a temperature coefficient for the loudspeaker voice coil.

26. A system as claimed in claim 24 wherein said estimation module is configured to determine said indication of power dissipation based on said estimated voice coil resistance and said second signal indicative of current flowing in said voice coil.

27. A thermal protection system for a loudspeaker comprising:
at least one input for receiving a first signal indicative of voltage applied to the voice coil of said loudspeaker and a second signal indicative of current flowing in said voice coil;
a temperature and power estimation module configured to determine:
an estimate of temperature of the voice coil based on an estimate of resistance of said voice coil which is determined based on said first and second signals;
an estimate of power dissipation in the voice coil based on said first signal, second signals and/or said estimate of resistance of said voice coil; and
an estimate of temperature of a thermal reservoir for heat produced in the voice coil based on a comparison of said estimate of temperature of the voice coil the voice coil and an estimate of rise of coil temperature based on a thermal speaker model and said estimate of power dissipation in the voice coil;
a gain controller configured to generate a gain control signal for modulating the gain of a signal processing chain driving said loudspeaker, wherein said gain control signal is generated as a function of each of said estimate of temperature of said voice coil, said estimate of power dissipation in the voice coil and said estimate of temperature of a thermal reservoir.

* * * * *